(12) United States Patent
Kobayashi

(10) Patent No.: US 11,956,969 B2
(45) Date of Patent: Apr. 9, 2024

(54) SEMICONDUCTOR STORAGE DEVICE USING TWO INSULATIVE STORAGE ELEMENTS AND NEURAL NETWORK DEVICE USING THE SAME

(71) Applicant: SONY GROUP CORPORATION, Tokyo (JP)

(72) Inventor: Toshiyuki Kobayashi, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 179 days.

(21) Appl. No.: 17/309,597

(22) PCT Filed: Nov. 21, 2019

(86) PCT No.: PCT/JP2019/045605
§ 371 (c)(1),
(2) Date: Jun. 9, 2021

(87) PCT Pub. No.: WO2020/129532
PCT Pub. Date: Jun. 25, 2020

(65) Prior Publication Data
US 2022/0020757 A1    Jan. 20, 2022

(30) Foreign Application Priority Data

Dec. 18, 2018  (JP) ................. 2018-236001

(51) Int. Cl.
*H10B 53/30*    (2023.01)
*G06N 3/063*    (2023.01)
(Continued)

(52) U.S. Cl.
CPC ............. *H10B 53/30* (2023.02); *G06N 3/063* (2013.01); *G11C 11/2275* (2013.01); *G11C 11/54* (2013.01)

(58) Field of Classification Search
CPC ........ H10B 53/30; H10B 51/30; G06N 3/063; G06N 3/045; G11C 11/2275; G11C 11/54;
(Continued)

(56) References Cited

U.S. PATENT DOCUMENTS 5,519,812 A   5/1996  Ishihara
6,285,577 B1  9/2001  Nakamura
(Continued)

FOREIGN PATENT DOCUMENTS

CN     1979898 A    6/2007
CN   108962898 A   12/2018
(Continued)

OTHER PUBLICATIONS

International Search Report and Written Opinion of PCT Application No. PCT/JP2019/045605, dated Jan. 28, 2020, 14 pages of ISRWO.

(Continued)

*Primary Examiner* — Jerome Leboeuf
(74) *Attorney, Agent, or Firm* — CHIP LAW GROUP

(57) ABSTRACT

Provided is a semiconductor storage device that includes a substrate, a first storage element formed on the substrate and including a first insulating film, and a second storage element formed on the substrate and including a second insulating film having a film thickness of equal to or greater than 0.5 times and equal to or less than 2 times a film thickness of the first insulating film, the second storage element differing from the first storage element in power consumption at a time of writing.

18 Claims, 12 Drawing Sheets

(51) Int. Cl.
*G11C 11/22* (2006.01)
*G11C 11/54* (2006.01)

(58) Field of Classification Search
CPC .......................... H01L 28/40; H01L 29/6684; H01L 29/78391
See application file for complete search history.

(56) References Cited

U.S. PATENT DOCUMENTS

| | | | |
|---|---|---|---|
| 6,730,950 B1* | 5/2004 | Seshadri | H01L 23/522 |
| | | | 257/532 |
| 2003/0235067 A1* | 12/2003 | Sakai | G11C 11/22 |
| | | | 365/145 |
| 2004/0103095 A1 | 5/2004 | Matsugu et al. | |
| 2005/0117394 A1* | 6/2005 | Nozawa | H03K 19/17712 |
| | | | 365/185.08 |
| 2007/0126042 A1 | 6/2007 | Kijima et al. | |
| 2018/0337055 A1 | 11/2018 | Yamaguchi | |
| 2021/0257015 A1* | 8/2021 | Yamazaki | G11C 11/24 |

FOREIGN PATENT DOCUMENTS

| | | |
|---|---|---|
| EP | 584844 A2 | 3/1994 |
| EP | 1089341 A2 | 4/2001 |
| EP | 3413332 A2 | 12/2018 |
| JP | 6-68288 A | 3/1994 |
| JP | 2001-102465 A | 4/2001 |
| JP | 2004-157756 A | 6/2004 |
| JP | 2007-157982 A | 6/2007 |
| JP | 2008-235339 A | 10/2008 |
| JP | 2018-195767 A | 12/2018 |
| KR | 10-2001-0030545 A | 4/2001 |
| KR | 10-2007-0058974 A | 6/2007 |
| KR | 10-2018-0127180 A | 11/2018 |

OTHER PUBLICATIONS

Shafiee, et al., "ISAAC: A Convolutional Neural Network Accelerator with In-Situ Analog Arithmetic in Crossbars", 2016 ACM/IEEE 43rd Annual International Symposium on Computer Architecture, (ISCA), 2016, 13 pages.

* cited by examiner

[FIG. 1] PRIOR ART
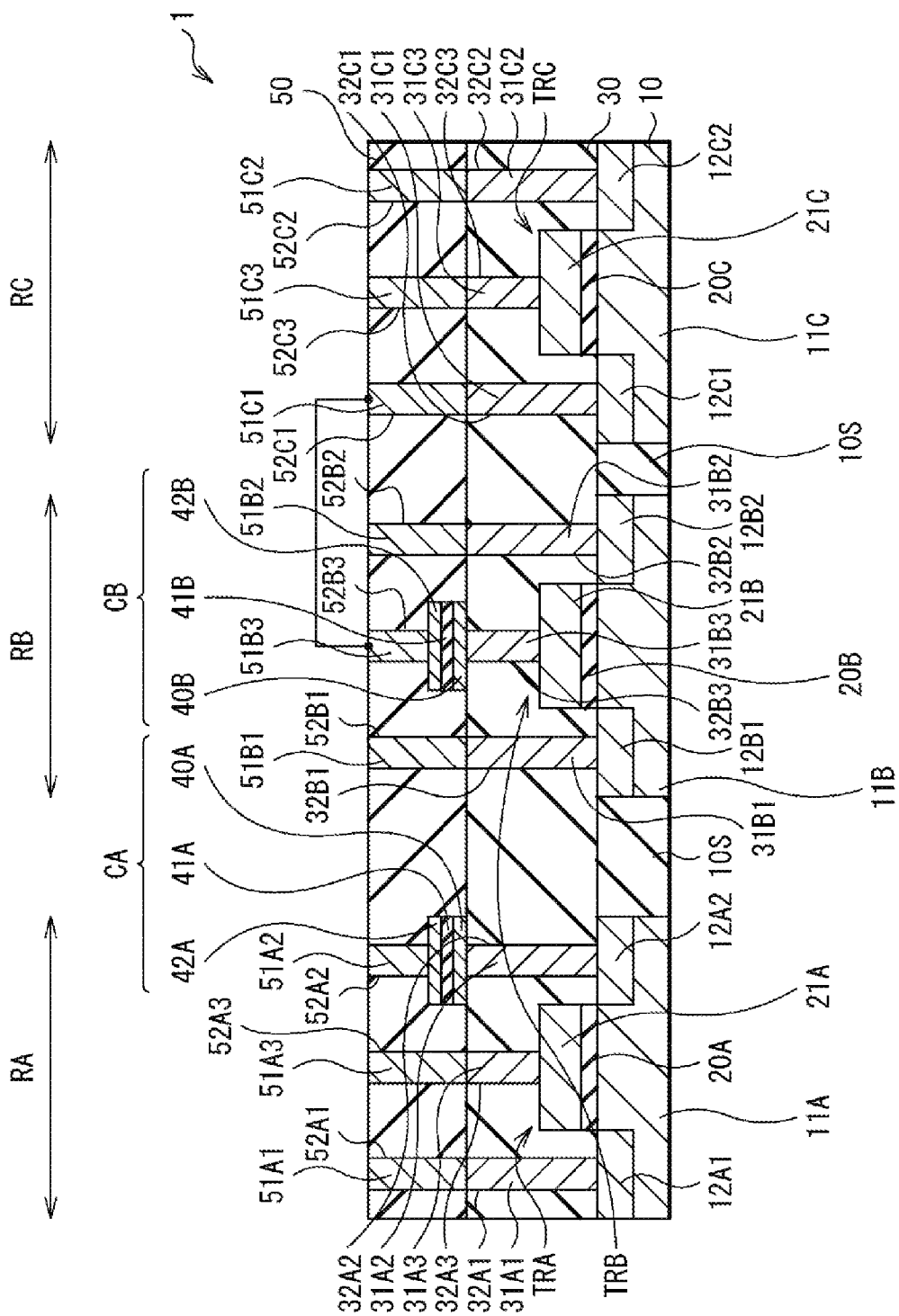

[FIG. 2A]
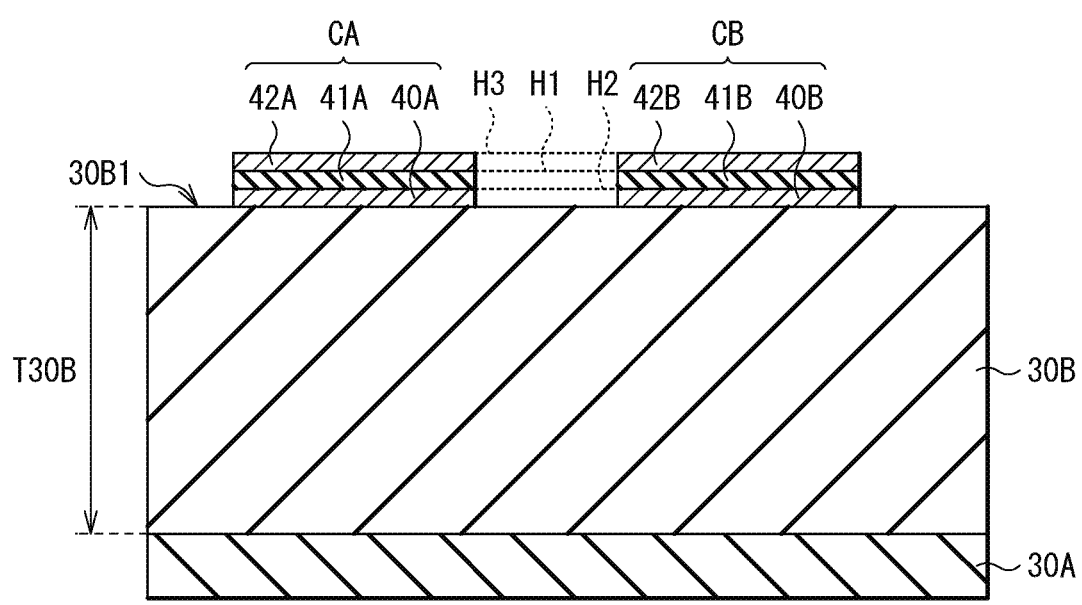

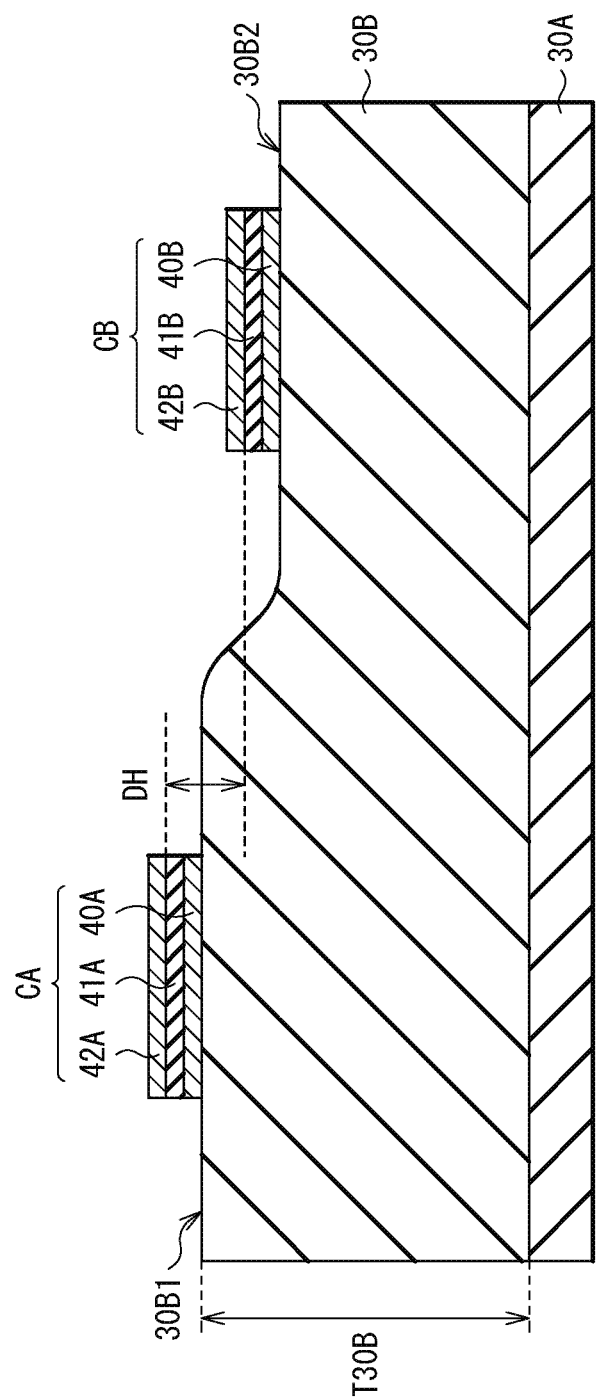
[FIG. 2B]

[FIG. 3A]
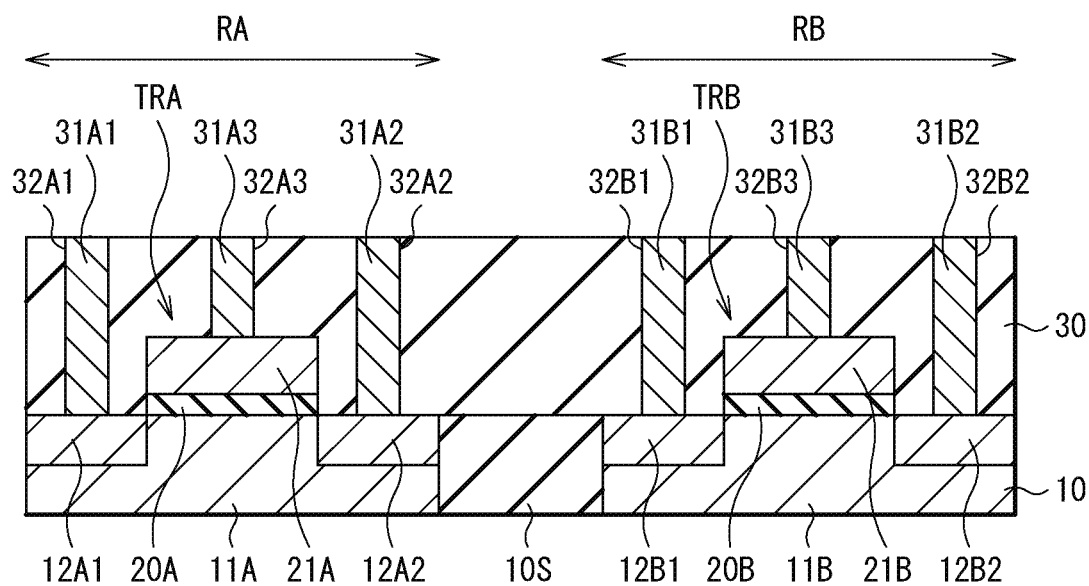
[FIG. 3B]
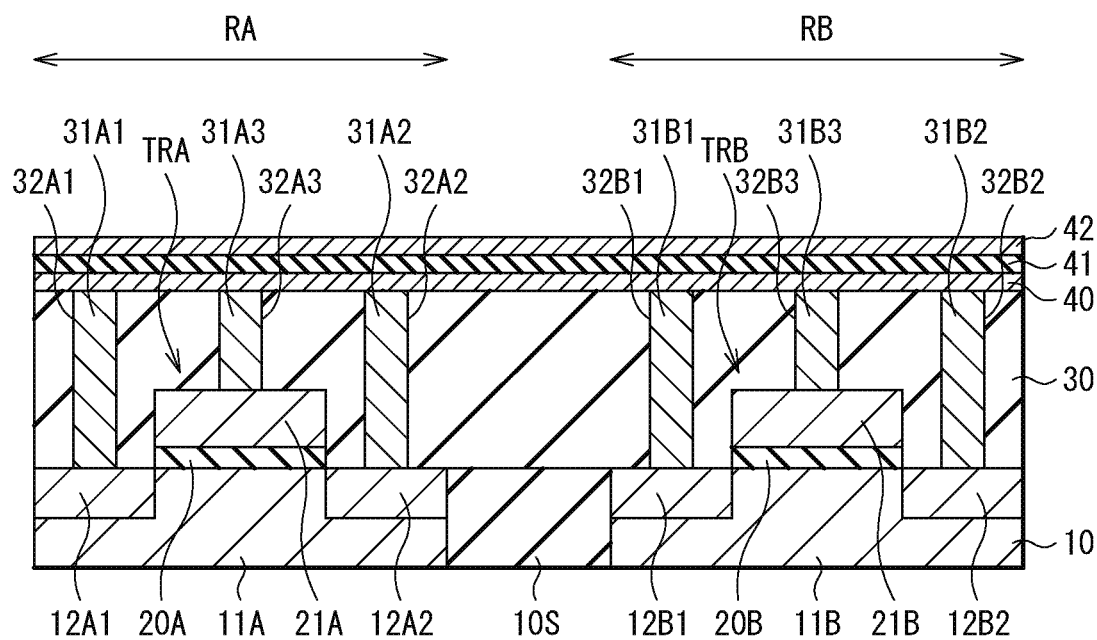

[FIG. 3C]
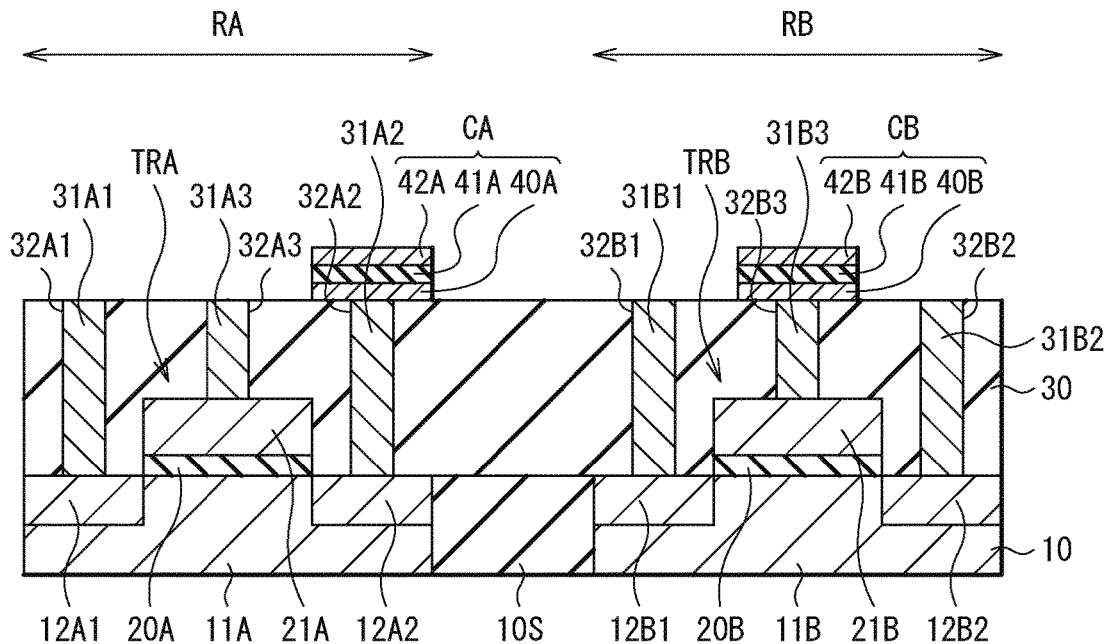
[FIG. 3D]
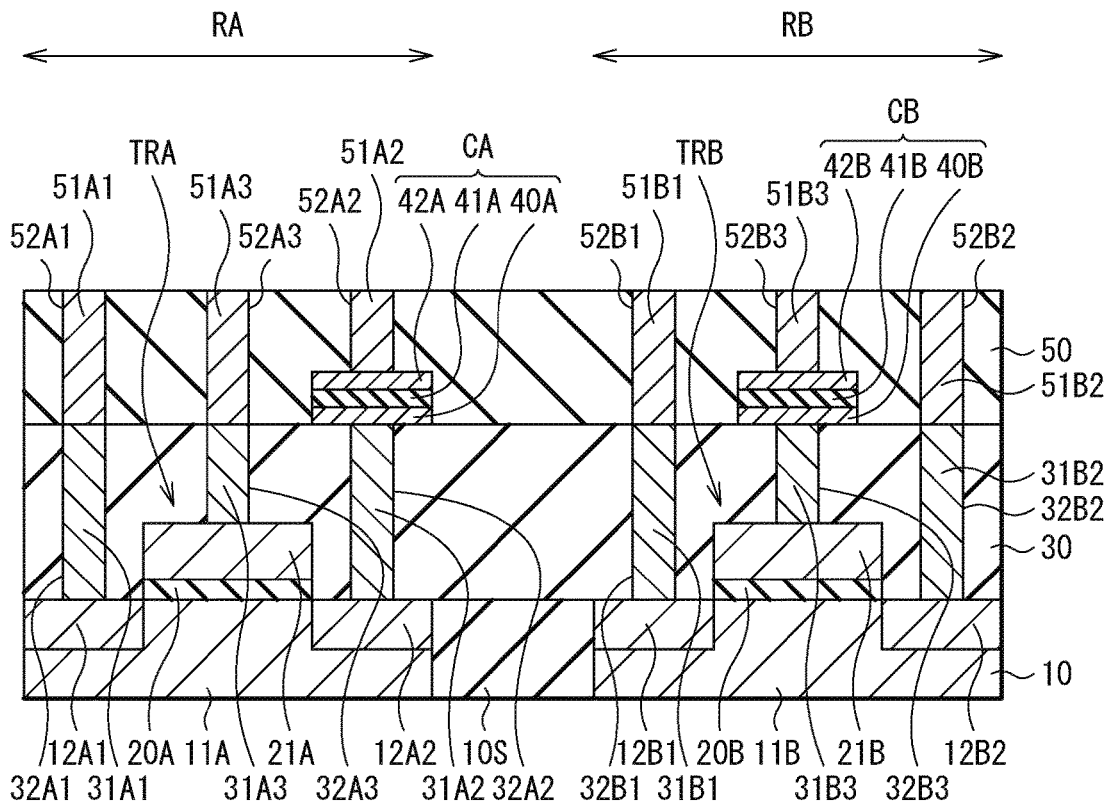

[FIG. 4]
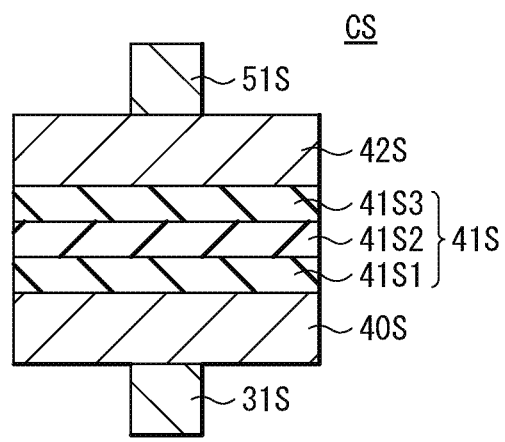
[FIG. 5]
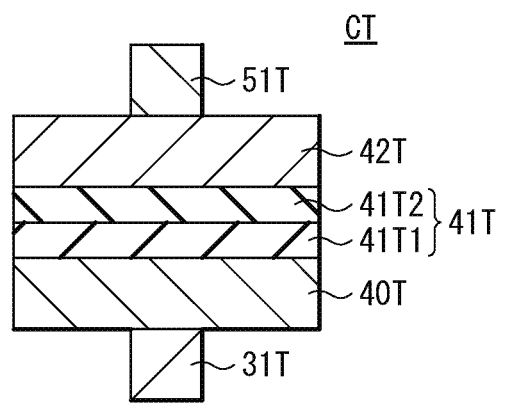

[FIG. 6]
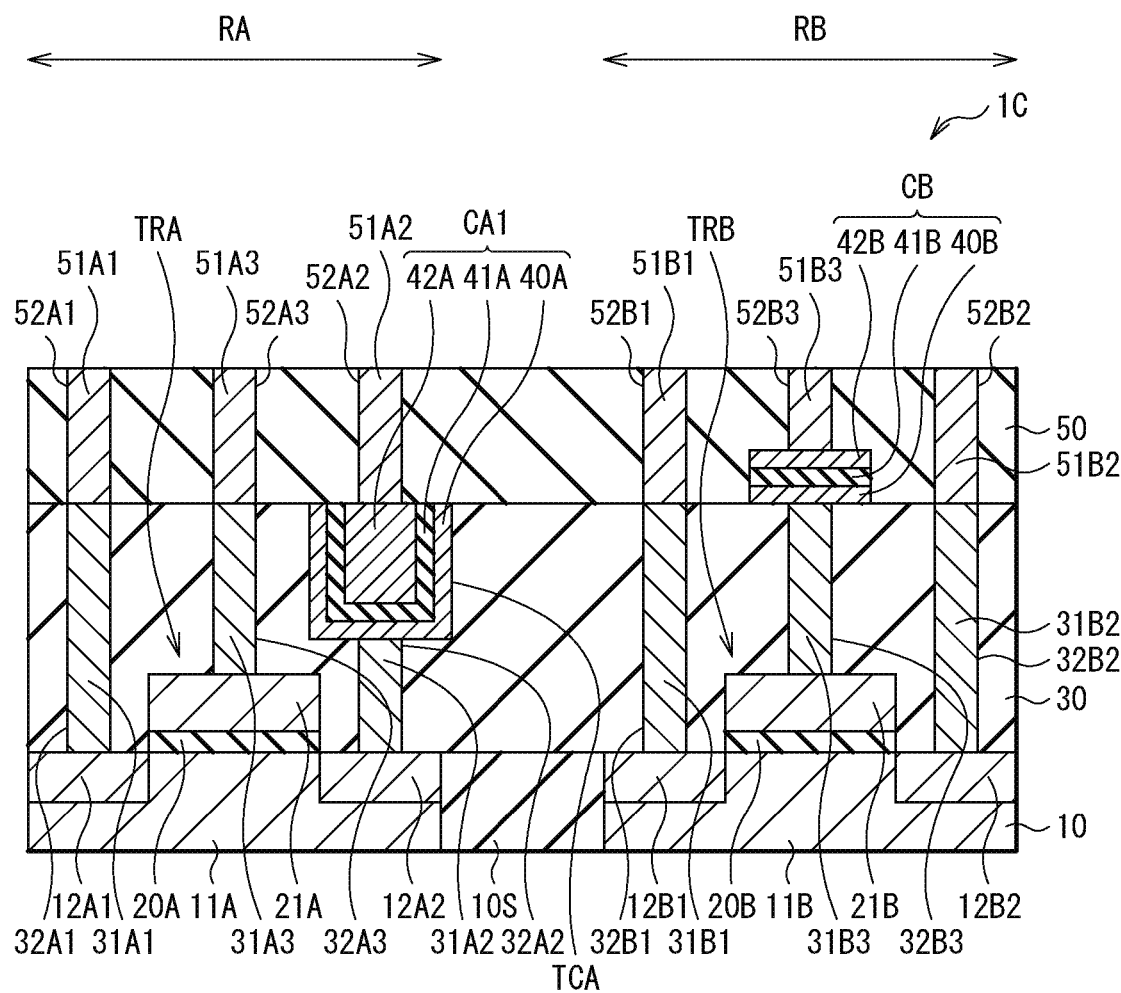

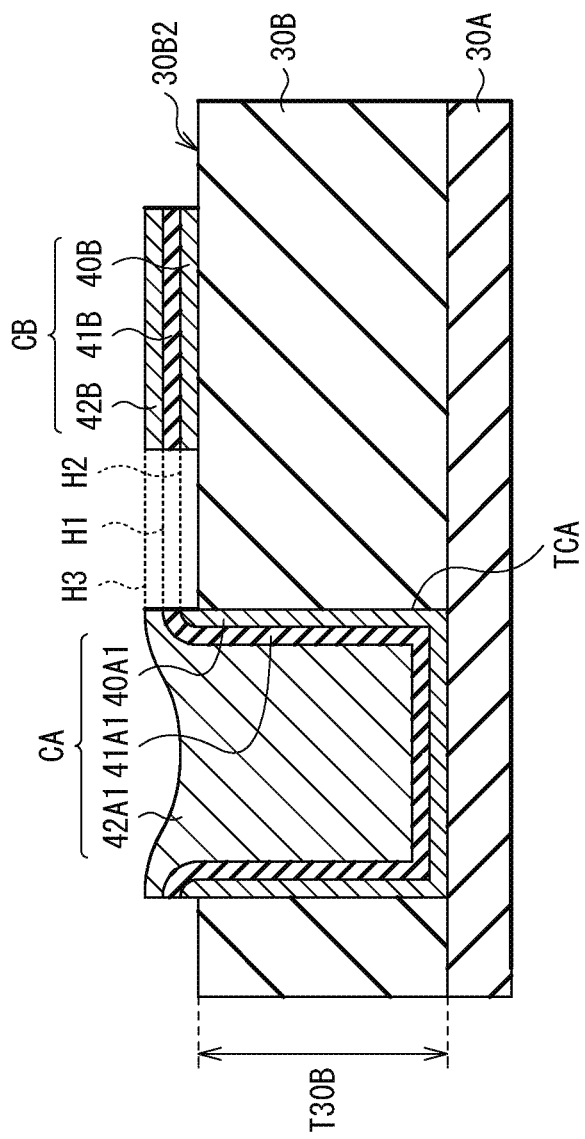
[FIG. 7]

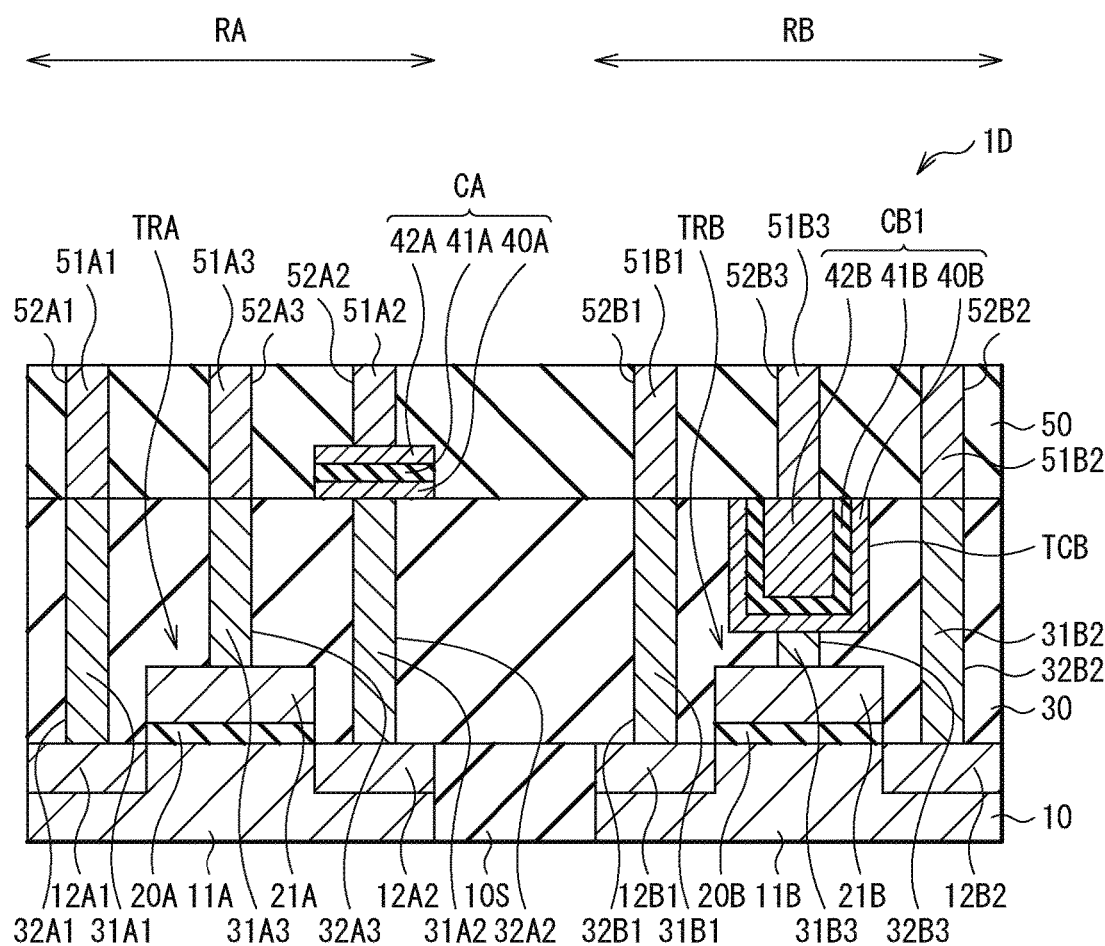
[FIG. 8]

[FIG. 9]
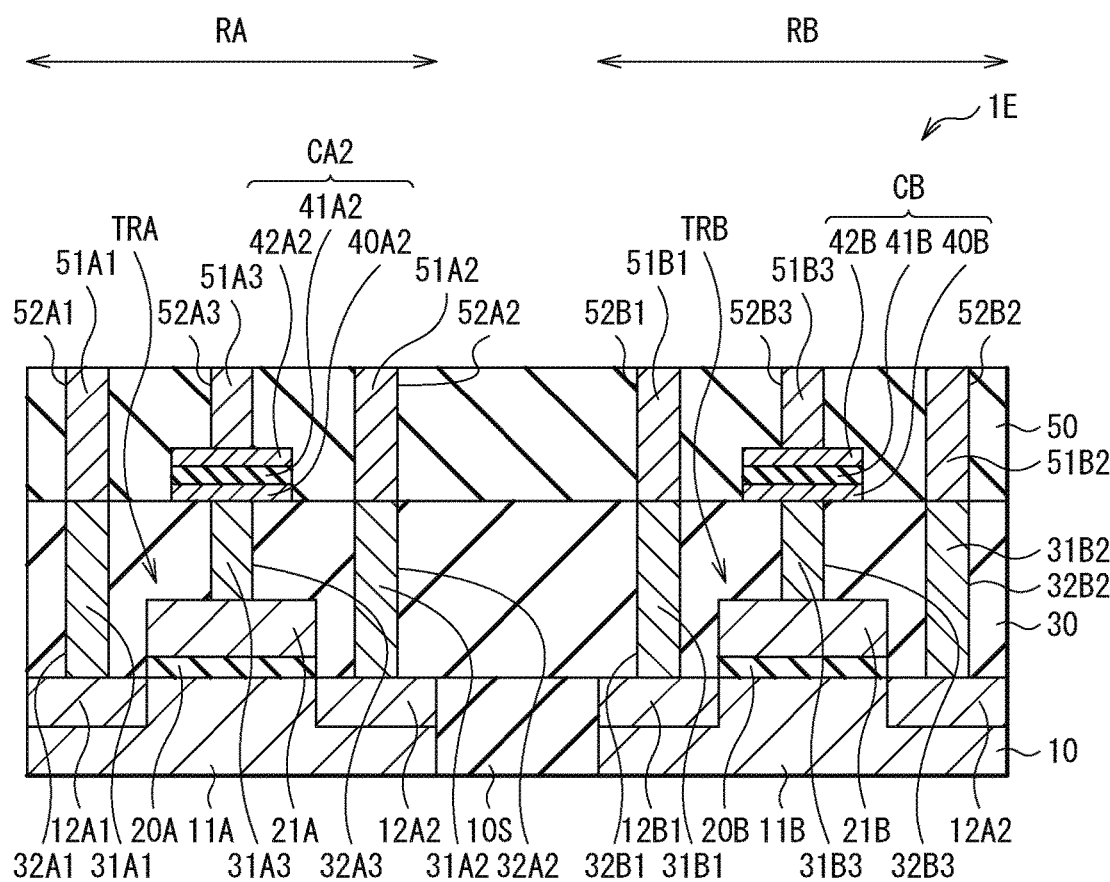

[FIG. 10]
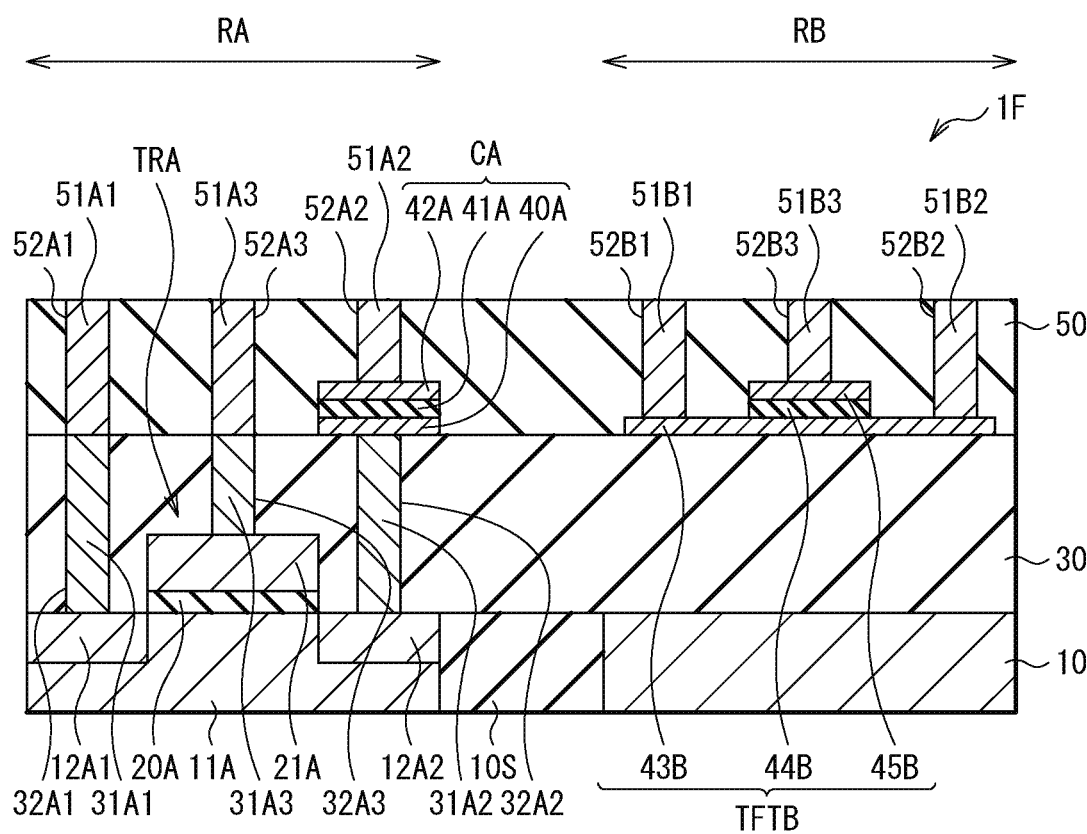

[FIG. 11]
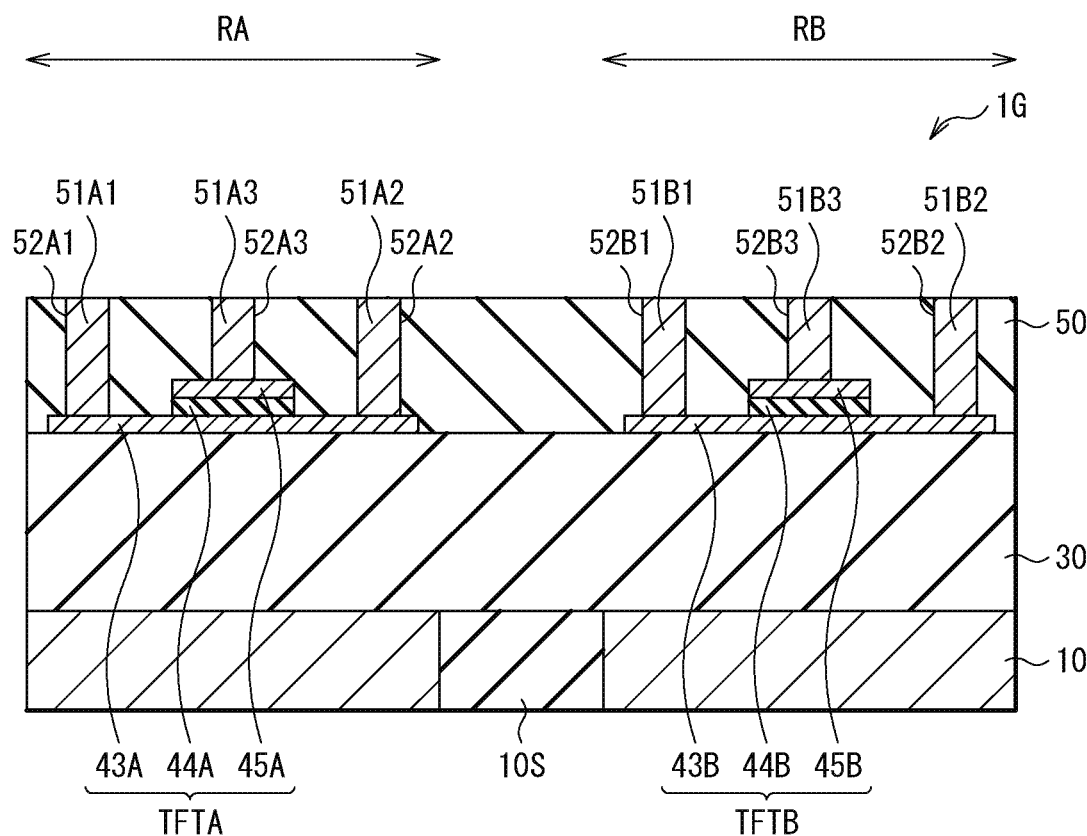

SEMICONDUCTOR STORAGE DEVICE USING TWO INSULATIVE STORAGE ELEMENTS AND NEURAL NETWORK DEVICE USING THE SAME

CROSS REFERENCE TO RELATED APPLICATIONS

This application is a U.S. National Phase of International Patent Application No. PCT/JP2019/045605 filed on Nov. 21, 2019, which claims priority benefit of Japanese Patent Application No. JP 2018-236001 filed in the Japan Patent Office on Dec. 18, 2018. Each of the above-referenced applications is hereby incorporated herein by reference in its entirety.

TECHNICAL FIELD

The present disclosure relates to a semiconductor storage device and to a neural network device including such a semiconductor storage device.

BACKGROUND ART

A convolution neural network device is one of semiconductor storage devices, and includes a synapse circuit that performs multiply-accumulate operation and a buffer memory or the like that temporarily holds a multiply-accumulate operation result.

PTL 1 discloses a configuration in which a ferroelectric material is used for the buffer memory, and PTL 2 discloses a configuration in which a ferroelectric transistor (FeFET: Ferroelectric Field Effect Transistor) is used for the synapse circuit.

Further, NPTL 1 reports a configuration using a resistance-changing memristor element for the synapse circuit and using an eDRAM (Embedded Dynamic Random Access Memory) for the buffer memory.

CITATION LIST

Patent Literature

PTL 1: Japanese Unexamined Patent Application Publication No. 2004-157756
PTL 2: Japanese Unexamined Patent Application Publication No. H6-68288

Non-Patent Literature

NPTL 1: Ali Shafiee et. al., "ISAAC: A Convolutional Neural Network Accelerator with In-Situ Analog Arithmetic in Crossbars", 2016 ACM/IEEE 43rd Annual International Symposium on Computer Architecture (ISCA), (2016).

SUMMARY OF THE INVENTION

Incidentally, it is desired to reduce manufacturing cost of a semiconductor storage device.

It is desirable to provide a semiconductor storage device that makes it possible to reduce manufacturing cost, and a neural network device including the semiconductor storage device.

A semiconductor storage device according to one embodiment of the present disclosure includes a substrate, a first storage element, and a second storage element. The first storage element is formed on the substrate and includes a first insulating film. The second storage element is formed on the substrate and includes a second insulating film having a film thickness of equal to or greater than 0.5 times and equal to or less than 2 times a film thickness of the first insulating film. The second storage element differs from the first storage element in power consumption at a time of writing.

A neural network device according to one embodiment of the present disclosure includes a substrate, a first storage element, and a second storage element. The first storage element is formed on the substrate and includes a first insulating film. The first storage element functions as a buffer memory that temporarily stores a multiply-accumulate operation result. The second storage element is formed on the substrate and includes a second insulating film having a film thickness of equal to or greater than 0.5 times and equal to or less than 2 times a film thickness of the first insulating film. The second storage element differs from the first storage element in power consumption at a time of writing and functions as an analog multiplier-accumulator.

In the semiconductor storage device according to one embodiment of the present disclosure and the neural network device according to one embodiment of the present disclosure, the second insulating film of the second storage element is made to have a film thickness of equal to or greater than 0.5 times and equal to or less than 2 times the film thickness of the first insulating film of the first storage element. Thus, it is possible to form the first insulating film and the second insulating film in the same process.

BRIEF DESCRIPTION OF DRAWINGS

FIG. 1 is a schematic cross-sectional diagram illustrating an example configuration of a semiconductor storage device according to one embodiment of the present disclosure.

FIG. 2A is an explanatory diagram illustrating an example configuration of the semiconductor storage device illustrated in FIG. 1.

FIG. 2B is an explanatory diagram illustrating an example configuration of the semiconductor storage device illustrated in FIG. 1.

FIG. 3A is a schematic cross-sectional diagram illustrating a method of manufacturing the semiconductor storage device illustrated in FIG. 1.

FIG. 3B is a schematic cross-sectional diagram illustrating a process following FIG. 3A.

FIG. 3C is a schematic cross-sectional diagram illustrating a process following FIG. 3B.

FIG. 3D is a schematic cross-sectional diagram illustrating a process following FIG. 3C.

FIG. 4 is a schematic cross-sectional diagram illustrating an example configuration of a storage element of a semiconductor storage device according to Modification Example 1.

FIG. 5 is a schematic cross-sectional diagram illustrating an example configuration of a storage element of a semiconductor storage device according to Modification Example 2.

FIG. 6 is a schematic cross-sectional diagram illustrating an example configuration of a semiconductor storage device according to Modification Example 3.

FIG. 7 is an explanatory diagram illustrating an example configuration of the semiconductor storage device illustrated in FIG. 6.

FIG. 8 is a schematic cross-sectional diagram illustrating an example configuration of a semiconductor storage device according to Modification Example 4.

FIG. 9 is a schematic cross-sectional diagram illustrating an example configuration of a semiconductor storage device according to Modification Example 5.

FIG. 10 is a schematic cross-sectional diagram illustrating an example configuration of a semiconductor storage device according to Modification Example 6.

FIG. 11 is a schematic cross-sectional diagram illustrating an example configuration of a semiconductor storage device according to Modification Example 7.

MODES FOR CARRYING OUT THE INVENTION

In the following, description is given of embodiments of the present disclosure in detail with reference to the drawings. It is to be noted that the description is given in the following order.

1. Embodiment (an example in which film thicknesses of first and second insulating films are substantially the same)
2. Modification Example 1 (an example in which a capacitor insulating film is a three-layer stack)
3. Modification Example 2 (an example in which the capacitor insulating film is a two-layer stack)
4. Modification Example 3 (an example in which a second storage element is a trench-type capacitor)
5. Modification Example 4 (an example in which a first storage element is a trench-type capacitor)
6. Modification Example 5 (an example in which the first and second storage elements are coupled to gates of transistors)
7. Modification Example 6 (an example in which the second storage element is a thin-film transistor (TFT (Thin Film Transistor)) including a gate insulating film of a ferroelectric material)
8. Modification Example 7 (an example in which the first and second storage elements are thin-film transistors (TFTs) including a gate insulating film of a ferroelectric material)

1. Embodiment

[Example Configuration]

FIG. 1 illustrates an example configuration of a semiconductor storage device (semiconductor storage device 1) according to one embodiment of the present disclosure. The semiconductor storage device 1 of the present embodiment includes a semiconductor substrate 10 and a capacitor CA and a capacitor CB provided on the semiconductor substrate 10, and a capacitor insulating film 41A and a capacitor insulating film 41B have substantially the same film thickness. The semiconductor storage device 1 further includes a field-effect transistor TRA, a field-effect transistor TRB, and a field-effect transistor TRC.

The capacitor CA includes a lower electrode 40A, the capacitor insulating film 41A, and an upper electrode 42A, and the lower electrode 40A, the capacitor insulating film 41A, and the upper electrode 42A are stacked in this order. The capacitor CA corresponds to a specific example of a "first storage element" according to the present disclosure. The capacitor insulating film 41A corresponds to a specific example of a "first insulating film" according to the present disclosure. The capacitor CB includes a lower electrode 40B, the capacitor insulating film 41B, and an upper electrode 42B, and the lower electrode 40B, the capacitor insulating film 41B, and the upper electrode 42B are stacked in this order. The capacitor CB corresponds to a specific example of a "second storage element" according to the present disclosure. The capacitor insulating film 41B corresponds to a specific example of a "second insulating film" according to the present disclosure. The configuration of the capacitor CA and the capacitor CB will be described in detail later.

The semiconductor substrate 10 is, for example, a silicon (Si) substrate, and is divided into a plurality of regions by an element isolation layer 10S such as STI (Shallow Trench Isolation) including silicon oxide ($SiO_2$). In the present embodiment, the semiconductor substrate 10 is divided by the element isolation layer 10S into, for example, a first region RA, a second region RB, and a third region RC. The semiconductor substrate 10 corresponds to a specific example of a "substrate" according to the present disclosure.

The field-effect transistor TRA is formed in the first region RA of the semiconductor substrate 10. The field-effect transistor TRA is, for example, an n-channel MOS (Metal-Oxide-Semiconductor) FET (Field Effect Transistor). The field-effect transistor TRA includes a channel formation region 11A, a gate insulating film 20A, a gate electrode 21A, and source-drain regions 12A1 and 12A2.

The channel formation region 11A is provided in the semiconductor substrate 10. The channel formation region 11A is, for example, a p-type semiconductor region formed by a p-type conductive impurity such as boron (B) being diffused in the semiconductor substrate 10.

The gate insulating film 20A is formed on the channel formation region 11A. The gate insulating film 20A includes, for example, an insulator such as silicon oxide, silicon nitride (SiN), or silicon oxynitride (SiON).

The gate electrode 21A is formed on the gate insulating film 20A. The gate electrode 21A includes, for example, an electric conductor, such as n-type polysilicon containing an n-type conductive impurity like phosphorus (P), copper (Cu), or aluminum (Al).

The source-drain regions 12A1 and 12A2 are formed so as to sandwich the channel formation region 11A in the semiconductor substrate 10 of portions corresponding to both sides of the gate electrode 21A. The source-drain regions 12A1 and 12A2 are, for example, n-type semiconductor regions formed by an n-type conductive impurity being diffused in the semiconductor substrate 10.

The field-effect transistor TRB is formed in the second region RB of the semiconductor substrate 10. The field-effect transistor TRB is, for example, an n-channel MOSFET, as with the field-effect transistor TRA. The field-effect transistor TRB includes a channel formation region 11B, a gate insulating film 20B, a gate electrode 21B, and source-drain regions 12B1 and 12B2. These have a configuration similar to that of the corresponding portions of the field-effect transistor TRA.

The field-effect transistor TRC is formed in the third region RC of the semiconductor substrate 10. The field-effect transistor TRC is, for example, an n-channel MOSFET, as with the field-effect transistor TRA. The field-effect transistor TRC includes a channel formation region 11C, a gate insulating film 20C, a gate electrode 21C, and source-drain regions 12C1 and 12C2. These have a configuration similar to that of the corresponding portions of the field-effect transistor TRA.

Above the field-effect transistor TRA, the field-effect transistor TRB, and the field-effect transistor TRC is formed an insulating film 30 covering the entire surface. The insulating film 30 is formed by a single-layer film or a multilayer film of an insulator such as silicon oxide, silicon nitride, or silicon oxynitride.

The insulating film 30 is provided with openings 32A1, 32A2, and 32A3 that reach, respectively, surfaces of the source-drain regions 12A1 and 12A2 and a top surface of the gate electrode 21A. An electric conductor fills the openings 32A1, 32A2, and 32A3 to form electrically conductive layers 31A1, 31A2, and 31A3. The electrically conductive layers 31A1, 31A2, and 31A3 are formed by, for example, a single-layer film or a multilayer film of an electric conductor such as copper, aluminum, gold (Au), platinum (Pt), titanium (Ti), molybdenum (Mo), tantalum (Ta), tungsten (W), titanium nitride (TiN), titanium tungsten (TiW), or tungsten nitride (WN). The electrically conductive layers 31A1, 31A2, and 31A3 are coupled, respectively, to the surfaces of the source-drain regions 12A1 and 12A2 and the top surface of the gate electrode 21A.

In a manner similar to the above, the insulating film 30 is provided with openings 32B1, 32B2, and 32B3 that reach, respectively, surfaces of the source-drain regions 12B1 and 12B2 and a top surface of the gate electrode 21B. An electric conductor fills the openings 32B1, 32B2, and 32B3 to form electrically conductive layers 31B1, 31B2, and 31B3. Further, the insulating film 30 is provided with openings 32C1, 32C2, and 32C3 that reach, respectively, surfaces of the source-drain regions 12C1 and 12C2 and a top surface of the gate electrode 21C. An electric conductor fills the openings 32C1, 32C2, and 32C3 to form electrically conductive layers 31C1, 31C2, and 31C3.

The capacitor CA is disposed in the first region RA, and is formed above the insulating film 30 so that the lower electrode 40A is coupled to the electrically conductive layer 31A2. The capacitor CB is disposed in the second region RB, and is formed above the insulating film 30 so that the lower electrode 40B is coupled to the electrically conductive layer 31B3. The configuration of the capacitor CA and the capacitor CB will be described in detail later.

Above the capacitor CA and the capacitor CB is formed an insulating film 50 covering the entire surface. The insulating film 50 is formed by a single-layer film or a multilayer film of an insulator such as silicon oxide, silicon nitride, or silicon oxynitride.

The insulating film 50 is provided with openings 52A1, 52A2, and 52A3 that reach, respectively, top surfaces of the electrically conductive layer 31A1, the upper electrode 42A, and the electrically conductive layer 31A3. An electric conductor fills the openings 52A1, 52A2, and 52A3 to form electrically conductive layers 51A1, 51A2, and 51A3. The electrically conductive layers 51A1, 51A2, and 51A3 have a configuration similar to that of the electrically conductive layers 31A1, 31A2, and 31A3.

In a manner similar to the above, the insulating film 30 is provided with the openings 32B1, 32B2, and 32B3 that reach, respectively, top surfaces of the electrically conductive layers 31B1 and 31B2 and the upper electrode 42B. An electric conductor fills the openings 32B1, 32B2, and 32B3 to form the electrically conductive layers 31B1, 31B2, and 31B3. Further, the insulating film 50 is provided with openings 52C1, 52C2, and 52C3 that reach, respectively, top surfaces of the electrically conductive layers 31C1, 31C2, and 31C3. An electric conductor fills the openings 52C1, 52C2, and 52C3 to form electrically conductive layers 51C1, 51C2, and 51C3. Further upper-layer wiring or the like may be provided to be coupled to electrically conductive layers 51A1, 51A2, 51A3, 51B1, 51B2, 51B3, 51C1, 51C2, and 51C3. For example, the electrically conductive layer 51B3 and the electrically conductive layer 51C1 are coupled via the upper-layer wiring.

The detailed configuration of the capacitor CA and the capacitor CB will be described. It is preferable that the capacitor CA and the capacitor CB have substantially the same film thickness, as will be described in detail later. For example, as described above, it is preferable that the capacitor insulating film 41A and the capacitor insulating film 41B have substantially the same film thickness. The capacitor insulating film 41A and the capacitor insulating film 41B each include a paraelectric material, a ferroelectric material, or a stack thereof. In the example illustrated in FIG. 1, the capacitor insulating film 41A and the capacitor insulating film 41B are each a monolayer film of a paraelectric material or a ferroelectric material. The paraelectric material is not particularly limited as long as it is a dielectric material exhibiting paraelectricity. The paraelectric material is, for example, silicon oxide, silicon nitride, silicon oxynitride, a stack thereof, or the like. The ferroelectric material is not particularly limited as long as it is a dielectric material exhibiting ferroelectricity. The ferroelectric material includes, for example, at least one of hafnium oxide ($HfO_2$), zirconium oxide ($ZrO_2$), or a solid solution thereof. Even hafnium oxide, zirconium oxide, and a solid solution thereof may be configured as the paraelectric material described above in a case where they exhibit paraelectricity.

In the example illustrated in FIG. 1, the lower electrode 40A and the upper electrode 42A are parallel-plate electrodes. The lower electrode 40A and the lower electrode 40B each include, for example, a metal such as copper, aluminum, titanium nitride, or tantalum nitride, or an electric conductor such as n-type polysilicon. As with the lower electrode 40A and the lower electrode 40B, the upper electrode 42A and the upper electrode 42B each include, for example, a metal such as copper, aluminum, titanium nitride, or tantalum nitride, or an electric conductor such as n-type polysilicon.

A case where the capacitor insulating film 41A and the capacitor insulating film 41B are paraelectric materials will be described. The capacitor CA and the capacitor CB described above each function as a storage element that stores information by accumulating electric charge.

In the field-effect transistor TRA, an output of the source-drain region 12A1 is determined in accordance with electric charge accumulated in the lower electrode 40A of the capacitor CA. For example, a magnitude of a source-drain current (a current flowing between a pair of the source-drain regions 12A1 and 12A2) that flows when the field-effect transistor TRA is turned from high-resistance (off) to low-resistance (on) corresponds to "0" and "1" of digital information. In this manner, the capacitor CA is configured to store binary information. The source-drain current is detected by a sense amplifier (not illustrated) coupled to the source-drain region 12A1 via the electrically conductive layer 51A1 or the like.

In writing information to the capacitor CA, for example, a predetermined voltage is applied to the source-drain region 12A1 with the field-effect transistor TRA turned on, and the field-effect transistor TRA is turned off. This configuration allows electric charge corresponding to the applied voltage to be accumulated in the lower electrode 40A of the capacitor CA.

Further, in the field-effect transistor TRB, a magnitude of a current of a channel formed in the channel formation region 11B is determined in accordance with electric charge accumulated in the capacitor CB. For example, by making an amount of electric charge held in the capacitor CB correspond to the magnitude of the current of the channel formed in the channel formation region 11B, the field-effect transistor TRB to which the capacitor CB is coupled is configured to function as a resistance-changing storage element.

In writing information to the capacitor CB, for example, a predetermined voltage is applied between one or both of the source-drain regions 12B1 and 12B2, and the electrically conductive layer 51B3. This configuration allows electric charge to be accumulated in the lower electrode 40B by a thus generated tunneling current to the lower electrode 40B.

Next, a case where the capacitor insulating film 41A and the capacitor insulating film 41B include ferroelectric materials will be described. The capacitor CA and the capacitor CB are each a capacitor including a ferroelectric layer sandwiched by electric conductor layers, and are also referred to as MFM (Metal-Ferroelectric-Metal) capacitors. A direction of spontaneous polarization of the ferroelectric material corresponds to "0" and "1" of digital information, and the information is able to be held for a long time period; it is therefore used as a non-volatile memory. When writing information, a voltage is applied from the outside to reverse the spontaneous polarization.

Storage elements using a ferroelectric material include a FeRAM (Ferroelectric Random Access Memory) storage element and a FeFET (Ferroelectric Field Effect Transistor) storage element, which differ in information readout method. The field-effect transistor TRA has a configuration in which a MFM capacitor is coupled to the source-drain region 12A2, and is a FeRAM storage element (hereinafter also referred to as FeRAM). In the FeRAM, when reading information, a polarization reversal current of a ferroelectric film when a voltage is applied from the outside is detected by a sense amplifier. It is polarized in a direction of the applied electric field in a case where the polarization reversal current is small, and it is polarized in a direction opposite to the applied electric field in a case where the polarization reversal current is large. After the reading, information is overwritten, which necessitates rewriting. The capacitor CA is coupled to the source-drain region 12A2 of the field-effect transistor TRA. This configuration allows voltage to be selectively applied to the capacitor CA at a time of reading or writing.

On the other hand, the FeFET storage element (hereinafter also referred to as FeFET) is a field-effect transistor using a ferroelectric material for a gate insulating film. Such a FeFET is also referred to as an MFS structure because it is a stack of metal-ferroelectric-semiconductor (Metal-Ferroelectric-Semiconductor). In the FeFET, a threshold voltage changes in accordance with a direction of spontaneous polarization of the ferroelectric material. That is, if a gate voltage is constant, a source-drain current changes, so that it is possible to read information by detecting the change with a sense amplifier. Unlike the FeRAM, it is possible to perform reading without reversing the polarization, because a voltage applied to the ferroelectric material is small. An access transistor may be additionally provided to prevent writing to unselected cells at a time of writing. It is possible to obtain similar characteristics from a MFIS (Metal? Ferroelectric? Insulator? Semiconductor) structure including a paraelectric layer interposed between a ferroelectric layer and a semiconductor layer, and from a MFMIS (Metal? Ferroelectric? Metal? Insulator? Semiconductor) structure further including a metal layer interposed between the ferroelectric layer and the paraelectric layer.

The field-effect transistor TRB has a configuration in which a MFM capacitor is coupled to the gate electrode 21B. The field-effect transistor TRB has the MFMIS structure, and exhibits a behavior similar to that of the FeFET as described above. The MFMIS includes an electric conductor layer as an intermediate electrode between the ferroelectric layer and the gate insulating film. A source-drain current changes as a potential of the intermediate electrode changes in accordance with spontaneous polarization of the ferroelectric material. The MFMIS is easier to manufacture than the MFS, which introduces a ferroelectric material in a transistor. On the other hand, a write voltage is higher than that of a MFS-FeFET or a MFM capacitor because the write voltage is applied via the gate insulating film, and energy consumption (power consumption) at a time of rewriting is large. In addition, to the field-effect transistor TRB is coupled the field-effect transistor TRC, which is an access transistor. Although an access transistor (the field-effect transistor TRC) is provided in the example illustrated in FIG. 1, an access transistor may not necessarily be provided.

It is preferable that the capacitor insulating film 41A and the capacitor insulating film 41B each include at least one of hafnium oxide, zirconium oxide, or a solid solution thereof. The above material exhibits ferroelectricity even in the form of a thin film of about 10 nm. Therefore, it is possible to make the MFM capacitor finer by using the above material as the capacitor insulating film. In addition, a thin film of the above material is able to be deposited by an ALD (Atomic Layer Deposition) method, which is one of CVD (Chemical Vapor Deposition) methods, and is also favorably applicable to a case of forming it along an inner wall of a high-aspect-ratio trench.

The capacitor insulating film 41A and the capacitor insulating film 41B are each preferably crystalline, for example. Spontaneous polarization of a ferroelectric material that is crystalline is able to be maintained for a long time. In this case, it is possible to increase information storage time.

It is preferable that the capacitor insulating film 41A and the capacitor insulating film 41B each include a crystalline layer and an amorphous layer. An amorphous layer has excellent insulating properties and is able to reduce leakage currents in the capacitor, which makes it possible to increase the information storage time.

In the present embodiment, sizes of the capacitor CA and the capacitor CB are substantially the same, materials included in the capacitor CA and materials included in the capacitor CB are substantially the same, and sizes of the field-effect transistor TRA and the field-effect transistor TRB are substantially the same. In the present embodiment, a voltage used for writing to the capacitor CB is different from a voltage used for writing to the capacitor CA in the configuration described above. Specifically, the voltage used for the writing to the capacitor CB is higher than the voltage used for the writing to the capacitor CA. In addition, power consumption for the writing to the capacitor CB is different from power consumption for the writing to the capacitor CA. Specifically, the power consumption for the writing to the capacitor CB is larger than the power consumption for the writing to the capacitor CA.

It has been described above that the capacitor insulating film 41A and the capacitor insulating film 41B preferably have substantially the same film thickness; specifically, the capacitor insulating film 41B preferably has a film thickness of equal to or greater than 0.5 times and equal to or less than 2 times the film thickness of the capacitor insulating film 41A. More preferably, equal to or greater than 0.8 times and equal to or less than 1.2 times. Most preferably, the film thickness of the capacitor insulating film 41B is the same as the film thickness of the capacitor insulating film 41A. Thus, it is possible to form the capacitor insulating film 41A and the capacitor insulating film 41B in the same process. It is sufficient if a difference between the film thickness of the capacitor insulating film 41B and the film thickness of the capacitor insulating film 41A is within a film thickness variation range based on film formation conditions, a base shape, etc. when manufactured in the same manufacturing process.

In addition, it is preferable that the sum of film thicknesses of the lower electrode 40B and the capacitor insulating film 41B be, for example, equal to or greater than 0.5 times and equal to or less than 2 times the sum of film thicknesses of the lower electrode 40A and the capacitor insulating film 41A. More preferably, equal to or greater than 0.8 times and equal to or less than 1.2 times. Most preferably, the sum of the film thicknesses of the lower electrode 40B and the capacitor insulating film 41B is the same as the sum of the film thicknesses of the lower electrode 40A and the capacitor insulating film 41A. Thus, it is possible to form the lower electrode 40A and the lower electrode 40B in the same process, and to form the capacitor insulating film 41A and the capacitor insulating film 41B in the same process. It is sufficient if a difference between the sum of the film thicknesses of the lower electrode 40B and the capacitor insulating film 41B and the sum of the film thicknesses of the lower electrode 40A and the capacitor insulating film 41A is within a film thickness variation range based on film formation conditions, a base shape, etc. when manufactured in the same manufacturing process.

It is preferable that the sum of film thicknesses of the capacitor insulating film 41B and the upper electrode 42B be equal to or greater than 0.5 times and equal to or less than 2 times the sum of film thicknesses of the capacitor insulating film 41A and the upper electrode 42A. More preferably, equal to or greater than 0.8 times and equal to or less than 1.2 times. Most preferably, the sum of the film thicknesses of the capacitor insulating film 41B and the upper electrode 42B is the same as the sum of the film thicknesses of the capacitor insulating film 41A and the upper electrode 42A. Thus, it is possible to form the capacitor insulating film 41A and the capacitor insulating film 41B in the same process, and to form the upper electrode 42A and the upper electrode 42B in the same process. It is sufficient if a difference between the sum of the film thicknesses of the capacitor insulating film 41B and the upper electrode 42B and the sum of the film thicknesses of the capacitor insulating film 41A and the upper electrode 42A is within a film thickness variation range based on film formation conditions, a base shape, etc. when manufactured in the same manufacturing process.

The film thickness of the capacitor CB (the sum of the film thicknesses of the lower electrode 40B, the capacitor insulating film 41B, and the upper electrode 42B included in the capacitor CB) is preferably equal to or greater than 0.5 times and equal to or less than 2 times the film thickness of the capacitor CA (the sum of the film thicknesses of the lower electrode 40A, the capacitor insulating film 41A, and the upper electrode 42A included in the capacitor CA). More preferably, equal to or greater than 0.8 times and equal to or less than 1.2 times. Most preferably, the film thickness of the capacitor CB is the same as the film thickness of the capacitor CA. Thus, it is possible to form the capacitor CA and the capacitor CB collectively. It is sufficient if a difference between the film thickness of the capacitor CB and the film thickness of the capacitor CA is within a film thickness variation range based on film formation conditions, a base shape, etc. when manufactured in the same manufacturing process.

Further, surface heights of the capacitor insulating film 41A and the capacitor insulating film 41B are preferably substantially the same. Referring to FIGS. 2A and 2B, description will be given on the above surface heights being substantially the same. FIGS. 2A and 2B are each an enlarged view of the capacitor CA and the capacitor CB in FIG. 1. It is to be noted that a lower insulating film 30A and an insulating film 30B correspond to the insulating film 30 illustrated in FIG. 1. In FIG. 2A, the insulating film 30B has a flat surface 30B1 of uniform height, and the capacitor CA and the capacitor CB are provided above the insulating film 30B. In the example illustrated in FIG. 2A, a height H1 of the highest portion of the capacitor insulating film 41A is the same as the height of the highest portion of the capacitor insulating film 41B. This is because the capacitor insulating film 41B and the capacitor insulating film 41A are formed above the flat insulating film 30B. In addition, a height H2 of the highest portion of the lower electrode 40A is the same as the height of the highest portion of the lower electrode 40B. Similarly, a height H3 of the highest portion of the upper electrode 42A is the same as the height of the highest portion of the upper electrode 42B.

As illustrated in FIG. 2A and FIG. 2B, for example, in a case where the insulating film 30 is a stacked film of the lower insulating film 30A and the insulating film 30B, there may be variations in the height of the insulating film 30B, as illustrated in FIG. 2B. In this case, the height of the highest portion of the capacitor insulating film 41A may not be the same as the height of the highest portion of the capacitor insulating film 41B.

The surface heights of the capacitor insulating film 41A and the capacitor insulating film 41B being substantially the same is assumed to mean, including the above case, that a height difference between the highest portions of the capacitor insulating film 41A and the capacitor insulating film 41B is equal to or less than a film thickness T30B of the insulating film 30B.

According to the above, the surface heights of the capacitor insulating film 41A and the capacitor insulating film 41B are preferably substantially the same; specifically, it is preferable that the height difference between the highest portions of the capacitor insulating film 41A and the capacitor insulating film 41B be, for example, equal to or less than the film thickness T30B of the insulating film 30B. More preferably, equal to or less than 0.5 times the film thickness T30B of the insulating film 30B. In a case where the height difference between the highest portions of the capacitor insulating film 41A and the capacitor insulating film 41B is equal to or less than the film thickness T30B of the insulating film 30B, the capacitor insulating film 41A and the capacitor insulating film 41B are able to be the same layer formed above the common insulating film (the insulating film 30B), and it is possible to form the capacitor insulating film 41A and the capacitor insulating film 41B in the same process.

[Method of Manufacturing Semiconductor Storage Device]

Next, referring to FIGS. 3A, 3B and 3D, a method of manufacturing the semiconductor storage device 1 will be described. FIGS. 3A, 3B and 3D are each plan views of a process in the method of manufacturing the semiconductor storage device 1. FIGS. 3A, 3B and 3D illustrate regions corresponding to the regions (the first region RA and the second region RB) provided with the field-effect transistors TRA and TRB of FIG. 1, and omit the field-effect transistor TRC (the third region RC).

First, as illustrated in FIG. 3A, the field-effect transistor TRA and the field-effect transistor TRB are formed on the semiconductor substrate 10. Specifically, the semiconductor substrate 10 is prepared in which the element isolation layer 10S is formed so as to define the formation regions of the respective transistors, such as the first region RA and the second region RB. Subsequently, the p-type impurity is diffused in the semiconductor substrate 10 by ion implantation or the like, to form the channel formation region 11A in the semiconductor substrate 10 in the first region RA, and to form the channel formation region 11B in the semiconductor substrate 10 in the second region RB.

Next, by a thermal oxidation method, a CVD method, or the like, for example, the gate insulating film 20A is formed on the surface of the channel formation region 11A in the first region RA, and the gate insulating film 20B is formed on the surface of the channel formation region 11B in the second region RB. The gate insulating film 20A and the gate insulating film 20B include, for example, silicon oxide, silicon nitride, silicon oxynitride, or the like.

Subsequently, by a CVD method or the like, for example, the gate electrode 21A is formed above the gate insulating film 20A in the first region RA, and the gate electrode 21B is formed above the gate insulating film 20B in the second region RB. For example, they may be formed by depositing an electrically conductive layer of polysilicon or the like on the entire surface and processing it into a gate electrode pattern. The gate insulating film 20A and the gate insulating film 20B are subjected to patterning similarly when patterning of the gate electrode 21A and the gate electrode 21B is performed.

Next, ion implantation of the n-type conductive impurity is performed using the gate electrode 21A and the gate electrode 21B as masks. Thus, the n-type conductive impurity is diffused on the surface of the semiconductor substrate 10 (the surface of the channel formation region 11A and the surface of the channel formation region 11B) on both sides of the gate electrode 21A and the gate electrode 21B, to form the source-drain regions 12A1 and 12A2 and the source-drain regions 12B1 and 12B2.

Subsequently, silicon oxide is deposited on the entire surface to cover the field-effect transistor TRA and the field-effect transistor TRB by a CVD method, for example, to form the insulating film 30. Next, in the insulating film 30 are formed the openings 32A1, 32A2, and 32A3 that reach, respectively, the surfaces of the source-drain regions 12A1 and 12A2 and the top surface of the gate electrode 21A. Similarly, the openings 32B1, 32B2, and 32B3 that reach, respectively, the surfaces of the source-drain regions 12B1 and 12B2 and the top surface of the gate electrode 21B are formed. Subsequently, an electric conductor such as tungsten, copper, or aluminum is deposited to fill the openings 32A1, 32A2, 32A3, 32B1, 32B2, and 32B3 by a CVD method or the like, and the electric conductor of the outside of the openings 32A1, 32A2, 32A3, 32B1, 32B2, and 32B3 is removed to form the electrically conductive layers 31A1, 31A2, 31A3, 31B1, 31B2, and 31B3.

Next, as illustrated in FIG. 3B, a lower electrode 40 is formed on the entire surface above the insulating film 30, for example, by depositing a metal such as titanium nitride by a sputtering method, or by depositing polysilicon by a CVD method. The lower electrode 40 is in contact with the electrically conductive layers 31A1, 31A2, 31A3, 31B1, 31B2, and 31B3 before patterning. Subsequently, an insulating film 41 including the capacitor insulating film 41A and the capacitor insulating film 41B is formed on the entire surface above the lower electrode 40 by the ALD method or another CVD method. That is, the capacitor insulating film 41A and the capacitor insulating film 41B are formed in the same process. The insulating film 41 includes, for example, a paraelectric material such as silicon oxide, a ferroelectric material such as hafnium oxide, or a stack thereof. Next, an upper electrode 42 is formed on the entire surface above the insulating film 41, for example, by depositing a metal such as titanium nitride by a sputtering method, or by depositing polysilicon by a CVD method.

Subsequently, as illustrated in FIG. 3C, the lower electrode 40, the insulating film 41, and the upper electrode 42 are subjected to patterning. By the patterning, the capacitor CA in which the lower electrode 40A, the capacitor insulating film 41A, and the upper electrode 42A are stacked is formed in the first region RA. Further, the capacitor CB in which the lower electrode 40B, the capacitor insulating film 41B, and the upper electrode 42B are stacked is formed in the second region RB. The above patterning is performed, for example, by forming a pattern of a photoresist film (not illustrated) by a photolithography process, and by performing an etching process such as RIE (reactive ion etching). The patterning allows the lower electrode 40A to be coupled to the electrically conductive layer 31A2 only and the lower electrode 40B to be coupled to the electrically conductive layer 31B3 only.

Next, as illustrated in FIG. 3D, silicon oxide is deposited on the entire surface to cover the capacitor CA and the capacitor CB by a CVD method, for example, to form the insulating film 50. Subsequently, in the insulating film 50 are formed the openings 52A1, 52A2, and 52A3 that reach, respectively, the top surfaces of the electrically conductive layer 31A1, the upper electrode 42A, and the electrically conductive layer 31A3. Similarly, openings 52B1, 52B2, and 52B3 that reach, respectively, the top surfaces of the electrically conductive layer 31B1, the electrically conductive layer 31B2, and the upper electrode 42B are formed. Next, an electric conductor such as copper or aluminum is deposited to fill the openings 52A1, 52A2, 52A3, 52B1, 52B2, and 52B3 by a damascene method, a CVD method, or the like, and the electric conductor of the outside of the openings 52A1, 52A2, 52A3, 52B1, 52B2, and 52B3 is removed to form the electrically conductive layers 51A1, 51A2, 51A3, 51B1, 51B2, and 51B3.

[Operation]

Next, the operation of the semiconductor storage device of the present embodiment will be described.

(Overview of Overall Operation)

First, an overview of the overall operation of the semiconductor storage device will be described with reference to FIG. 1. Description will be given on the case where the capacitor insulating film 41A and the capacitor insulating film 41B are paraelectric materials. The capacitor CA and the capacitor CB described above each function as a storage element that stores information by accumulating electric charge. When reading information stored in the capacitor CA from the field-effect transistor TRA, the magnitude of the source-drain current that flows when the field-effect transistor TRA is turned from high-resistance (off) to low-resistance (on) is detected by the sense amplifier. When writing information to the capacitor CA, a predetermined voltage is applied to the source-drain region 12A1 with the field-effect transistor TRA turned on, and the field-effect transistor TRA is turned off. When reading information stored in the capacitor CB from the field-effect transistor TRB, the source-drain current flowing at a magnitude corresponding to the amount of electric charge held in the capacitor CB is detected. When writing information to the capacitor CB, a predetermined voltage is applied between one or both of the source-drain regions 12B1 and 12B2, and the electrically conductive layer 51B3, and electric charge is accumulated in the lower electrode 40B by the tunneling current to the lower electrode 40B.

Next, the case where the capacitor insulating film 41A and the capacitor insulating film 41B include ferroelectric materials will be described. The capacitor CA and the capacitor CB store information on the basis of the direction of spontaneous polarization of a ferroelectric film. When reading information from the field-effect transistor TRA, the polarization reversal current of the ferroelectric film is detected by the sense amplifier. When writing information, a voltage is applied from the outside to control the direction of spontaneous polarization of the ferroelectric film. When reading information from the field-effect transistor TRB, a change in the source-drain current is detected by a sense amplifier, because the threshold voltage changes in accordance with the direction of spontaneous polarization of the ferroelectric film in the field-effect transistor TRB. When writing information, a voltage is applied from the outside to control the direction of spontaneous polarization of the ferroelectric film.

(Detailed Operation)

Description will be given on the case where the capacitor insulating film 41A and the capacitor insulating film 41B are paraelectric materials. The capacitor CA and the capacitor CB described above each function as a storage element that stores information by accumulating electric charge. To read information stored in the capacitor CA from the field-effect transistor TRA, the source-drain current that flows when the field-effect transistor TRA is turned from high-resistance (off) to low-resistance (on) is detected by the sense amplifier. The information is read by making the magnitude of the source-drain current correspond to "0" and "1" of the digital information. In writing information to the capacitor CA, for example, a predetermined voltage is applied to the source-drain region 12A1 with the field-effect transistor TRA turned on, and the field-effect transistor TRA is turned off. Thus, it is possible to accumulate electric charge corresponding to the applied voltage in the lower electrode 40A of the capacitor CA, making it possible to store information.

In the field-effect transistor TRB, the magnitude of the current of the channel formed in the channel formation region 11B is determined in accordance with electric charge accumulated in the capacitor CB. For example, it functions as a resistance-changing storage element by making the amount of electric charge held in the capacitor CB correspond to the magnitude of the current of the channel formed in the channel formation region 11B. In writing information to the capacitor, for example, a predetermined voltage is applied between the semiconductor substrate 10 and the electrically conductive layer 51B3. Thus, electric charge is accumulated in the lower electrode 40B of the capacitor CB, making it possible to store information.

Next, the case where the capacitor insulating film 41A and the capacitor insulating film 41B include ferroelectric materials will be described. The field-effect transistor TRA is a FeRAM, and is able to read information stored in the capacitor CA by detecting, with the sense amplifier, the polarization reversal current of a ferroelectric film when a voltage is applied from the outside. To write information to the capacitor CA, a predetermined voltage is applied to the capacitor CA from the outside to control the direction of spontaneous polarization of the ferroelectric film. This allows information to be stored.

The field-effect transistor TRB is a FeFET of the MFMIS structure. Because the threshold voltage changes in accordance with the direction of spontaneous polarization of the ferroelectric material, it is possible to read information by detecting a change in the source-drain current with the sense amplifier. In addition, to write information to the field-effect transistor TRB, a predetermined voltage is applied to the capacitor CB from the outside to control the direction of spontaneous polarization of the ferroelectric film. This allows information to be stored. Here, at the time of writing, the voltage is applied to the capacitor CB via the gate insulating film. The applied voltage is therefore higher than the voltage used when writing to the field-effect transistor TRA (FeRAM), and the energy consumption (power consumption) at the time of rewriting is larger.

The field-effect transistor TRA (FeRAM) in which the capacitor insulating film 41A is a ferroelectric material reads the stored information on the basis of the polarization reversal current, whereas the field-effect transistor TRA (eDRAM) in which the capacitor insulating film 41A is a paraelectric material reads a discharge current of electric charge accumulated in the capacitor CA. The eDRAM is able to read information at lower voltages than the FeRAM. In addition, in the field-effect transistor TRA (FeRAM) in which the capacitor insulating film 41A is a ferroelectric material, it is possible to obtain a charge/discharge current from the capacitor CA as with the configuration in which the capacitor insulating film 41A is a paraelectric material. For this reason, for the field-effect transistor TRA (FeRAM) in which the capacitor insulating film 41A is a ferroelectric material, it is possible to store and read information as with the field-effect transistor TRA (eDRAM) in which the capacitor insulating film 41A is a paraelectric material.

[Workings]

Storage elements that differ from each other in power consumption at the time of writing are generally formed by completely different processes. due to a difference in configuration. In contrast, in the semiconductor storage device 1 of the present embodiment, as described above, the film thickness of the capacitor insulating film 41B included in the capacitor CB is made to be equal to or greater than 0.5 times and equal to or less than 2 times the film thickness of the capacitor insulating film 41A included in the capacitor CA. Thus, it is possible to form the capacitor insulating film 41A and the capacitor insulating film 41B in the same process.

[Effects]

As described above, in the present embodiment, the film thickness of the capacitor insulating film 41B included in the capacitor CB is made to be equal to or greater than 0.5 times and equal to or less than 2 times the film thickness of the capacitor insulating film 41A included in the capacitor CA. This makes it possible to form, in the same process, the capacitor insulating film 41A and the capacitor insulating film 41B of the two storage elements differing from each other in power consumption, making it possible to reduce the manufacturing cost.

The semiconductor storage device of the present embodiment is applicable to a convolution neural network device. The convolution neural network device includes a synapse circuit that performs multiply-accumulate operation and a buffer memory or the like that temporarily holds a multiply-accumulate operation result. The buffer memory may have a short information storage time of about 10 ms, but has high rewrite frequency. Therefore, it is desirable that power consumption at the time of rewriting be small. On the other hand, the synapse circuit has a long information storage time of about 10 years, and has low rewrite frequency. Therefore, power consumption at the time of rewriting may be large. The semiconductor storage device of the present embodiment is a storage device suitable for characteristics demanded of the buffer memory and the synapse circuit described above. That is, the buffer memory is implementable by the field-effect transistor TRA of the present embodiment. Further, the synapse circuit is implementable by the field-effect transistor TRB of the present embodiment.

2. Modification Example 1

In the above embodiment, the capacitor insulating film 41A and the capacitor insulating film 41B are each made to have a single-layer configuration of a paraelectric material or a ferroelectric material, but are not limited thereto. Alternatively, for example, the capacitor insulating film 41A and the capacitor insulating film 41B may each include, for example, a stack of a crystalline ferroelectric material and an amorphous paraelectric material.

FIG. 4 illustrates an example configuration of a storage element (capacitor) of a semiconductor storage device 1A according to Modification Example 1. In this example, the capacitor CA and the capacitor CB have a configuration of a capacitor CS illustrated in FIG. 4. In the capacitor CS, a capacitor insulating film 41S is formed above a lower electrode 40S, and an upper electrode 42S is formed above it. The capacitor insulating film 41S is a stack of insulating films, and includes a first sub-capacitor insulating film 41S1, a second sub-capacitor insulating film 41S2, and a third sub-capacitor insulating film 41S3 from the lower electrode 40S side. The first sub-capacitor insulating film 41S1 and the third sub-capacitor insulating film 41S3 includes a crystalline ferroelectric material, for example. The second sub-capacitor insulating film 41S2 includes an amorphous paraelectric material, for example. The lower electrode 40S and the upper electrode 42S are similar to those in the above embodiment. Except for the above point, it is similar to the above embodiment. An electrically conductive layer 31S is coupled to the lower electrode 40S, and an electrically conductive layer 51S is coupled to the upper electrode 42S.

In the configuration in which the capacitor insulating film 41B is a ferroelectric material in the capacitor CB of the above embodiment, if a leakage current from the electric conductor layer or the semiconductor layer on the ferroelectric material to the intermediate electrode is present, a ratio between the source-drain currents in the 0 state and the 1 state may decrease with time. Therefore, it is desirable to suppress the leakage current from the electric conductor layer on the ferroelectric material to the intermediate electrode.

In the semiconductor storage device 1A of the present modification example, in addition to the effects of the above embodiment, it is possible to increase the information storage time, because the capacitor insulating film includes a crystalline ferroelectric material. Further, it is possible to reduce the leakage current in the capacitor, because it includes an amorphous paraelectric material, which makes it possible to increase the information storage time.

3. Modification Example 2

In Modification Example 1 described above, the capacitor insulating film is made to be a stack of the three layers of the first to third sub-capacitor insulating films, but is not limited thereto. Alternatively, for example, it may be a two-layer stack of a first sub-capacitor insulating film and a second sub-capacitor insulating film.

FIG. 5 illustrates an example configuration of a storage element (capacitor) of a semiconductor storage device 1B according to Modification Example 2. In this example, the capacitor CA and the capacitor CB have a configuration of a capacitor CT illustrated in FIG. 5. In the capacitor CT, a capacitor insulating film 41T is formed above a lower electrode 40T, and an upper electrode 42T is formed above it. The capacitor insulating film 41T is a stack of insulating films, and includes a first sub-capacitor insulating film 41T1 and a second sub-capacitor insulating film 41T2 from the lower electrode 40T side. The first sub-capacitor insulating film 41S1 includes an amorphous paraelectric material, for example. The second sub-capacitor insulating film 41S2 includes a crystalline ferroelectric material, for example. Alternatively, the first sub-capacitor insulating film 41S1 may include a crystalline ferroelectric material, and the second sub-capacitor insulating film 41S2 may include an amorphous paraelectric material. The lower electrode 40T and the upper electrode 42T are similar to those in the above embodiment. An electrically conductive layer 31T is coupled to the lower electrode 40T, and an electrically conductive layer 51T is coupled to the upper electrode 42T. Except for the above point, it is similar to the above embodiment.

In the semiconductor storage device 1B of the present modification example, in addition to the effects of the above embodiment, it is possible to increase the information storage time, because the capacitor insulating film includes a crystalline ferroelectric material. Further, it is possible to reduce the leakage current in the capacitor, because it includes a crystalline ferroelectric material, which makes it possible to increase the information storage time.

4. Modification Example 3

In the above embodiment, the capacitor CA and the capacitor CB are made to be parallel-plate type capacitors, but are not limited thereto. Alternatively, for example, one or both of the capacitor CA and the capacitor CB may be a capacitor provided in a trench.

FIG. 6 illustrates an example configuration of a semiconductor storage device 1C according to Modification Example 3. In this example, the capacitor CA is a trench-type capacitor formed inside a trench TCA provided on the insulating film 30. The capacitor CA1 includes a stack of a lower electrode 40A1, a capacitor insulating film 41A1, and an upper electrode 42A1. The lower electrode 40A1 and the capacitor insulating film 41A1 are formed along an inner wall of the trench TCA. The upper electrode 42A1 is formed above the capacitor insulating film 41A1 to fill the trench TCA. Except for the above point, it is similar to the above embodiment.

The capacitor insulating film 41A and the capacitor insulating film 41B have substantially the same film thickness, as in the above embodiment. For example, the film thickness of the capacitor insulating film 41B is equal to or greater than 0.5 times and equal to or less than 2 times the film thickness of the capacitor insulating film 41A1. It is preferably equal to or greater than 0.8 times and equal to or less than 1.2 times, and most preferably the same. As the film thickness of the capacitor insulating film 41A1, a portion that is flat and uniform in thickness at the bottom of the trench TCA is assumed to be referred to.

For example, the sum of film thicknesses of the lower electrode 40B and the capacitor insulating film 41B is preferably equal to or greater than 0.5 times and equal to or less than 2 times the sum of film thicknesses of the lower electrode 40A1 and the capacitor insulating film 41A1. It is more preferably equal to or greater than 0.8 times and equal to or less than 1.2 times, and most preferably the same. As the sum of the film thicknesses of the lower electrode 40A1 and the capacitor insulating film 41A1, a portion that is flat and uniform in thickness at the bottom of the trench TCA is referred to.

Further, the surface heights of the capacitor insulating film 41A and the capacitor insulating film 41B are preferably substantially the same. For example, the height difference between the highest portions of the capacitor insulating film 41B and the capacitor insulating film 41A is preferably equal to or less than the film thickness T30B of the insulating film 30B. More preferably, equal to or less than 0.5 times the film thickness T30B of the insulating film 30B. Most preferably, the heights at the highest portions of the capacitor insulating film 41B and the capacitor insulating film 41A are the same.

FIG. 7 is an enlarged view of the capacitor CA1 and the capacitor CB. The capacitor CA1 of the present modification example is formed inside the trench TCA. In the capacitor CA1, the lower electrode 40A1 and the capacitor insulating film 41A are formed along the inner wall of the trench TCA, and are formed so as to ride on the surface of the insulating film 30B at the edge of the trench TCA. The lower electrode 40A1 and the capacitor insulating film 41A at the edge of the trench TCA remain after patterning. The same applies to the upper electrode 42A1 provided to fill the trench TCA. In the present modification example, the height of the highest surface of the capacitor insulating film 41A that is substantially the same as the highest surface of the capacitor insulating film 41B refers to the height of the capacitor insulating film 41A formed at the edge of the trench TCA.

Thus, if a height difference between the highest surface of the capacitor insulating film 41B and the highest surface of the capacitor insulating film 41A formed at the edge of the trench TCA is equal to or less than the film thickness T30B of the insulating film 30B, it is possible to form the capacitor insulating film 41B and the capacitor insulating film 41A in the same process. The same applies to the lower electrode 40A1 and the lower electrode 40B, and to the upper electrode 42A1 and the upper electrode 42B.

In a FeRAM where the capacitor insulating film 41A1 is a ferroelectric material, it can be difficult to discriminate data if the capacitor is made finer, because the polarization reversal current of the capacitor CA1 is proportional to the area of the capacitor. In the present modification example, a cylindrical groove (trench) is formed on the insulating film 30 where the capacitor CA1 is to be provided, and the capacitor CA1 is provided therein. Thus, it is possible to enlarge the capacitor area. It is to be noted that the shape of the trench may be a shape other than a cylindrical shape, such as a square prism shape or a polygonal prism shape.

In the semiconductor storage device 1C of the present modification example, it is possible to obtain effects similar to those of the above embodiment even though the capacitor CA1 is formed in the trench TCA. In addition, it is possible to ensure the polarization reversal current of the capacitor CA1 even if the capacitor CA1 is made finer as in the present modification example, which makes it possible to suppress difficulty in data discrimination.

Further, also in an eDRAM where the capacitor insulating film 41A is a paraelectric material, it is possible to ensure accumulation capacitance of the capacitor even if made finer, which makes it possible to suppress difficulty in the data determination.

5. Modification Example 4

In Modification Example 3 described above, the capacitor CA is a capacitor provided in a trench, but is not limited thereto. Alternatively, for example, the capacitor CB may be a capacitor provided in a trench.

FIG. 8 illustrates an example configuration of a semiconductor storage device 1D according to Modification Example 4. In this example, the capacitor CB is a trench-type capacitor CB1 formed inside a trench TCB provided on the insulating film 30. The trench-type capacitor CB1 includes a stack of a lower electrode 40B1, a capacitor insulating film 41B1, and an upper electrode 42B1. The lower electrode 40B1 and the capacitor insulating film 41B1 are formed along an inner wall of the trench TCB. The upper electrode 42B1 is formed above the capacitor insulating film 41B1 to fill the trench TCB. Except for the above point, it is similar to Modification Example 3.

The trench-shaped capacitor is also applicable to the capacitor CB. In addition, both the capacitor CA and the capacitor CB may be trench-shaped.

6. Modification Example 5

In the above embodiment, the capacitor CA is coupled to the gate electrode 21A of the field-effect transistor TRA, and the capacitor CB is coupled to the source-drain region 12B2 of the field-effect transistor TRB, but are not limited to this configuration. Alternatively, for example, a configuration may be adopted in which the capacitors CA and CB are coupled to the gate electrodes 21A and 21B of the field-effect transistors TRA and TRB.

FIG. 9 illustrates an example configuration of a semiconductor storage device 1E according to Modification Example 5. In this example, the capacitor CA is a capacitor (capacitor CA2) configured to be coupled to the gate electrode 21A of the field-effect transistor TRA. The capacitor CA2 includes a stack of a lower electrode 40A2, a capacitor insulating film 41A2, and an upper electrode 42A2.

A neural network device to which the present modification example is applied will be described. The neural network device includes two synapse circuits with different read/write methods. The two synapse circuits are a synapse circuit with high rewrite frequency and a synapse circuit with low rewrite frequency, depending on algorithms. In a case where the rewrite frequency is high, an additional access transistor may be added to the configuration of FIG. 9. It is possible to reduce the write voltage by accumulating electric charge at a node between the access transistor and the capacitor CA2, or at a node between the access transistor and the capacitor CB. In this case, the capacitor CA2 or the capacitor CB does not undergo polarization reversal. In a case where the rewrite frequency is low, a high voltage is applied to reverse the polarization. The readout method is similar to that in the above embodiment.

7. Modification 6

In the above embodiment, the field-effect transistor TRB is a MOSFET formed on the semiconductor substrate 10, and the capacitor CB is coupled to the gate electrode 21B, but are not limited to this configuration. Alternatively, for example, a configuration may be adopted in which the field-effect transistor TRB is a thin-film transistor TFTB, and the capacitor insulating film 41B corresponds to a gate insulating film 44B of the thin-film transistor TFTB.

FIG. 10 illustrates an example configuration of a semiconductor storage device 1F according to Modification Example 6. In this example, the field-effect transistor TRB is the thin-film transistor TFTB. The thin-film transistor TFTB is stacked above the insulating film 30, in the order of a semiconductor layer 43B of polysilicon or the like, the gate insulating film 44B, and a gate electrode 45B. The electrically conductive layers 51B1 and 51B2 are provided to be coupled to source-drain regions of the semiconductor layer 43B. In addition, the electrically conductive layer 51B3 is provided to be coupled to the gate electrode 45B.

In the present modification example, the gate insulating film 44B of the thin-film transistor TFTB corresponds to the capacitor insulating film 41B in the above embodiment. That is, the gate insulating film 44B and the capacitor insulating film 41A have substantially the same film thickness. For example, the film thickness of the gate insulating film 44B is equal to or greater than 0.5 times and equal to or less than 2 times the film thickness of the capacitor insulating film 41A. Except for the above point, it is similar to the above embodiment.

It may be used as not only a semiconductor storage device using a MOSFET formed on the semiconductor substrate 10 but also as a semiconductor storage device using a thin-film transistor.

8. Modification Example 7

In Modification Example 5 described above, the capacitors CA and CB are coupled to the gate electrodes 21A and 21B of the field-effect transistors TRA and TRB, but are not limited to this configuration. Alternatively, for example, a configuration may be adopted in which the field-effect transistor TRA is a thin-film transistor TFTA, the capacitor insulating film 41A corresponds to a gate insulating film 44A of the thin-film transistor TFTA, the field-effect transistor TRB is the thin-film transistor TFTB, and the capacitor insulating film 41B corresponds to the gate insulating film 44B of the thin-film transistor TFTB.

FIG. 11 illustrates an example configuration of a semiconductor storage device 1G according to Modification Example 7. In this example, the field-effect transistor TRA is the thin-film transistor TFTA and the field-effect transistor TRB is the thin-film transistor TFTB. The thin-film transistor TFTA is stacked above the insulating film 30, in the order of a semiconductor layer 43A of polysilicon or the like, the gate insulating film 44A, and a gate electrode 45A. The electrically conductive layers 51A1 and 51A2 are provided to be coupled to source-drain regions of the semiconductor layer 43A. In addition, the electrically conductive layer 51A3 is provided to be coupled to the gate electrode 45A. The thin-film transistor TFTB also has a similar configuration.

In the present modification example, the gate insulating film 44A of the thin-film transistor TFTA corresponds to the capacitor insulating film 41A in the above embodiment, and the gate insulating film 44B of the thin-film transistor TFTB corresponds to the capacitor insulating film 41B in the above embodiment. That is, the gate insulating film 44A and the gate insulating film 44B have substantially the same film thickness. For example, the film thickness of the gate insulating film 44B is equal to or greater than 0.5 times and equal to or less than 2 times the film thickness of the gate insulating film 44A. Except for the above point, it is similar to the above embodiment.

It may be used as not only a semiconductor storage device using a MOSFET formed on the semiconductor substrate 10 but also as a semiconductor storage device using a thin-film transistor.

Although the embodiment and Modification Example 1 to 7 have been described above, the present technology is not limited to these embodiment and the like, and various modifications may be made.

In the above embodiment has been described an example of application to the convolution neural network device, but the application is not limited thereto. Alternatively, it may be applied to a semiconductor storage device other than the convolution neural network device. For example, it may be applied to a microprocessor including a non-volatile storage device in which a program is stored and a volatile main storage device.

It is to be noted that the effects described in this specification are merely illustrative and non-limiting, and other effects may be provided.

It is to be noted that the present technology may have the following configurations. According to the present technology having the following configurations, a film thickness of a second insulating film included in a second capacitor is made to be equal to or greater than 0.5 times and equal to or less than 2 times a film thickness of a first insulating film included in a first capacitor. This makes it possible to reduce the manufacturing cost even though two storage elements that differ from each other in power consumption are included.

(1)

A semiconductor storage device including:
a substrate;
a first storage element formed on the substrate and including a first insulating film; and
a second storage element formed on the substrate and including a second insulating film having a film thickness of equal to or greater than 0.5 times and equal to or less than 2 times a film thickness of the first insulating film, the second storage element differing from the first storage element in power consumption at a time of writing.

(2)

The semiconductor storage device according to (1), in which the power consumption at the time of writing is larger for the second storage element than for the first storage element.

(3)

The semiconductor storage device according to (1) or (2), in which
the first storage element includes a first capacitor including a first lower electrode, the first insulating film formed above the first lower electrode, and a first upper electrode formed above the first insulating film, and
the second storage element includes a second capacitor including a second lower electrode, the second insulating film formed above the second lower electrode, and a second upper electrode formed above the second insulating film.

(4)

The semiconductor storage device according to (3), in which a sum of film thicknesses of the first lower electrode and the first insulating film is equal to or greater than 0.5 times and equal to or less than 2 times a sum of film thicknesses of the second lower electrode and the second insulating film.

(5)

The semiconductor storage device according to (3), in which a sum of film thicknesses of the first insulating film and the first upper electrode is equal to or greater than 0.5 times and equal to or less than 2 times a sum of film thicknesses of the second insulating film and the second upper electrode.

(6)

The semiconductor storage device according to (3), in which a film thickness of the first capacitor is equal to or greater than 0.5 times and equal to or less than 2 times a film thickness of the second capacitor.

(7)

The semiconductor storage device according to any one of (1) to (6), further including a third insulating film provided above the substrate and below the first storage element and the second storage element,
in which a height difference between highest portions of the first insulating film and the second insulating film is equal to or less than a film thickness of the third insulating film.

(8)

The semiconductor storage device according to any one of (1) to (7), in which the first insulating film and the second insulating film are each a ferroelectric film.

(9)

The semiconductor storage device according to any one of (1) to (8), in which the first insulating film and the second insulating film each include at least one of hafnium oxide, zirconium oxide, or a solid solution thereof.

(10)

The semiconductor storage device according to any one of (1) to (9), in which the first insulating film and the second insulating film are each crystalline.

(11)

The semiconductor storage device according to any one of (1) to (9), in which the first insulating film and the second insulating film each include a crystalline layer and an amorphous layer.

(12)

The semiconductor storage device according to any one of (1) to (11), further including:
a first field-effect transistor including a first channel formation region provided in the substrate, a first gate insulating film formed on the first channel formation region, a first gate electrode formed on the first gate insulating film, and first source-drain regions formed to sandwich the first channel formation region in the substrate of portions corresponding to both sides of the first gate electrode, the first field-effect transistor being provided to be electrically coupled to the first storage element; and
a second field-effect transistor including a second channel formation region provided in the substrate, a second gate insulating film formed on the second channel formation region, a second gate electrode formed on the second gate insulating film, and second source-drain regions formed to sandwich the second channel formation region in the substrate of portions corresponding to both sides of the second gate electrode, the second field-effect transistor being provided to be electrically coupled to the second storage element.

(13)

The semiconductor storage device according to (12), in which
the first storage element is electrically coupled to the first source-drain region, and
the second storage element is electrically coupled to the second gate electrode.

(14)

The semiconductor storage device according to any one of (1) to (13), further including a third insulating film provided above the substrate and below the first storage element and the second storage element, in which
the third insulating film has a first-storage-element recess where the first storage element is to be formed, and
the first insulating film is formed along an inner wall of the first-storage-element recess.

(15)

The semiconductor storage device according to (3), further including a third insulating film provided above the substrate and below the first storage element and the second storage element, in which
the third insulating film has a first-storage-element recess where the first storage element is to be formed, and
the first insulating film and the first lower electrode are formed along an inner wall of the first-storage-element recess.

(16)

The semiconductor storage device according to any one of (1) to (13), further including a third insulating film provided above the substrate and below the first storage element and the second storage element, in which
the third insulating film has a second-storage-element recess where the second storage element is to be formed, and
the second insulating film is formed along an inner wall of the second-storage-element recess.

(17)

The semiconductor storage device according to (3), further including a third insulating film provided above the substrate and below the first storage element and the second storage element, in which
the third insulating film has a second-storage-element recess where the second storage element is to be formed, and
the second insulating film and the second lower electrode are formed along an inner wall of the second-storage-element recess.

(18)

The semiconductor storage device according to (1), further including a first field-effect transistor including a first channel formation region provided in the substrate, a first gate insulating film formed on the first channel formation region, a first gate electrode formed on the first gate insulating film, and first source-drain regions formed to sandwich the first channel formation region in the substrate of portions corresponding to both sides of the first gate electrode, the first field-effect transistor being provided to be electrically coupled to the first storage element, in which
the second storage element includes a thin-film transistor, and the second insulating film includes a gate insulating film of the thin-film transistor.

(19)

The semiconductor storage device according to (1), in which
the first storage element includes a first thin-film transistor, and the first insulating film includes a gate insulating film of the first thin-film transistor, and the second storage element includes a second thin-film transistor, and the second insulating film includes a gate insulating film of the second thin-film transistor.

(20) A method of manufacturing a semiconductor storage device, including:
forming, at a same time on a substrate, a first insulating film and a second insulating film having a film thickness of equal to or greater than 0.5 times and equal to or less than 2 times a film thickness of the first insulating film;
forming a first storage element including the first insulating film; and
forming a second storage element including the second insulating film and differing from the first storage element in power consumption at a time of writing.

(21) A neural network device including:
a substrate;
a first storage element formed on the substrate and including a first insulating film, the first storage element functioning as a buffer memory that temporarily stores a multiply-accumulate operation result; and
a second storage element formed on the substrate and including a second insulating film having a film thickness of equal to or greater than 0.5 times and equal to or less than 2 times a film thickness of the first insulating film, the second storage element differing from the first storage element in power consumption at a time of writing and functioning as an analog multiplier-accumulator.

This application claims the benefit of Japanese Priority Patent Application No. 2018-236001 filed with the Japan Patent Office on Dec. 18, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor storage device, comprising:
a substrate;
a first storage element on the substrate, wherein
the first storage element includes a first insulating film; and
a second storage element on the substrate, wherein
the second storage element includes a second insulating film,
a film thickness of the second insulating film is equal to or greater than 0.5 times and equal to or less than 2 times a film thickness of the first insulating film,
the second storage element is different from the first storage element in power consumption at a time of writing, and
each of the first insulating film and the second insulating film includes a crystalline layer and an amorphous layer.

2. The semiconductor storage device according to claim 1, wherein the power consumption at the time of writing is larger for the second storage element than for the first storage element.

3. The semiconductor storage device according to claim 1, wherein
the first storage element is a first capacitor,
the first storage element further includes a first lower electrode and a first upper electrode,
the first insulating film is above the first lower electrode,
the first upper electrode is above the first insulating film,
the second storage element is a second capacitor,
the second storage element further includes a second lower electrode and a second upper electrode,
the second insulating film is above the second lower electrode, and
the second upper electrode is above the second insulating film.

4. The semiconductor storage device according to claim 3, wherein a sum of film thicknesses of the second lower electrode and the second insulating film is equal to or greater than 0.5 times and equal to or less than 2 times a sum of film thicknesses of the first lower electrode and the first insulating film.

5. The semiconductor storage device according to claim 3, wherein a sum of film thicknesses of the second insulating film and the second upper electrode is equal to or greater than 0.5 times and equal to or less than 2 times a sum of film thicknesses of the first insulating film and the first upper electrode.

6. The semiconductor storage device according to claim 3, wherein the film thickness of the first capacitor is equal to or greater than 0.5 times and equal to or less than 2 times the film thickness of the second capacitor.

7. The semiconductor storage device according to claim 1, further comprising a third insulating film above the substrate and below the first storage element and the second storage element, wherein
a height difference between highest portions of the first insulating film and the second insulating film is equal to or less than a film thickness of the third insulating film.

8. The semiconductor storage device according to claim 1, wherein each of the first insulating film and the second insulating film includes at least one of hafnium oxide, zirconium oxide, or a solid solution thereof.

9. The semiconductor storage device according to claim 1, further comprising:
a first field-effect transistor that includes:
a first channel formation region in the substrate,
a first gate insulating film on the first channel formation region,
a first gate electrode on the first gate insulating film, and
first source-drain regions formed to sandwich the first channel formation region in the substrate of portions corresponding to both sides of the first gate electrode, wherein
the first field-effect transistor is electrically coupled to the first storage element; and
a second field-effect transistor that includes:
a second channel formation region in the substrate,
a second gate insulating film on the second channel formation region,
a second gate electrode on the second gate insulating film, and
second source-drain regions to sandwich the second channel formation region in the substrate of portions corresponding to both sides of the second gate electrode, wherein
the second field-effect transistor is electrically coupled to the second storage element.

10. The semiconductor storage device according to claim 9, wherein
the first storage element is electrically coupled to a first source-drain region of the first source-drain regions, and
the second storage element is electrically coupled to the second gate electrode.

11. The semiconductor storage device according to claim 1, further comprising a third insulating film provided above the substrate and below the first storage element and the second storage element, wherein the third insulating film has a first-storage-element recess where the first storage element is to be formed, and the first insulating film is formed along an inner wall of the first-storage-element recess.

12. The semiconductor storage device according to claim 3, further comprising a third insulating film provided above the substrate and below the first storage element and the second storage element, wherein the third insulating film has a first-storage-element recess where the first storage element is to be formed, and the first insulating film and the first lower electrode are formed along an inner wall of the first-storage-element recess.

13. The semiconductor storage device according to claim 1, further comprising a third insulating film above the substrate and below the first storage element and the second storage element, wherein
the third insulating film has a second-storage-element recess,
the second storage element is inside the second-storage-element recess, and
the second insulating film is along an inner wall of the second-storage-element recess.

14. The semiconductor storage device according to claim 3, further comprising a third insulating film above the substrate and below the first storage element and the second storage element, wherein
the third insulating film has a second-storage-element recess,
the second storage element is inside the second-storage-element recess, and
the second insulating film and the second lower electrode are along an inner wall of the second-storage-element recess.

15. The semiconductor storage device according to claim 1, further comprising:
a first field-effect transistor including a first channel formation region provided in the substrate,
a first gate insulating film formed on the first channel formation region, a first gate electrode formed on the first gate insulating film, and
first source-drain regions formed to sandwich the first channel formation region in the substrate of portions corresponding to both sides of the first gate electrode, wherein the first field-effect transistor being provided to be electrically coupled to the first storage element,
the second storage element comprises a thin-film transistor, and
the second insulating film comprises a gate insulating film of the thin-film transistor.

16. The semiconductor storage device according to claim 1, wherein
the first storage element comprises a first thin-film transistor,
the first insulating film comprises a gate insulating film of the first thin-film transistor,
the second storage element comprises a second thin-film transistor, and
the second insulating film comprises a gate insulating film of the second thin-film transistor.

17. A neural network device, comprising:
a substrate;
a first storage element on the substrate, wherein
the first storage element includes a first insulating film, and
the first storage element is a buffer memory that temporarily stores a multiply-accumulate operation result; and
a second storage element on the substrate, wherein
the second storage element includes a second insulating film,
a film thickness of the second insulating film is equal to or greater than 0.5 times and equal to or less than 2 times a film thickness of the first insulating film,
the second storage element is different from the first storage element in power consumption at a time of writing,
the second storage element is an analog multiplier-accumulator, and
each of the first insulating film and the second insulating film includes a crystalline layer and an amorphous layer.

18. A semiconductor storage device, comprising:
a substrate;
a first storage element on the substrate, wherein
the first storage element includes a first insulating film; and
a second storage element on the substrate, wherein
the second storage element includes a second insulating film,
a film thickness of the second insulating film is equal to or greater than 0.5 times and equal to or less than 2 times a film thickness of the first insulating film,
the second storage element is different from the first storage element in power consumption at a time of writing, and
each of the first insulating film and the second insulating film is a ferroelectric film.

* * * * *